US012796396B2

(12) United States Patent
Toyosawa et al.

(10) Patent No.: US 12,796,396 B2
(45) Date of Patent: Nov. 10, 2026

(54) CLEANING AND TRANSFER EQUIPMENT, WAFER TREATMENT EQUIPMENT, TRANSFER EQUIPMENT, AND CLEANING AND TRANSFER METHODS

(71) Applicant: EBARA CORPORATION, Tokyo (JP)

(72) Inventors: Kotaro Toyosawa, Tokyo (JP); Dai Yoshinari, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 10 days.

(21) Appl. No.: 18/650,055

(22) Filed: Apr. 29, 2024

(65) Prior Publication Data

US 2024/0379405 A1 Nov. 14, 2024

(30) Foreign Application Priority Data

May 10, 2023 (JP) ................................ 2023-077683

(51) Int. Cl.
*H10P 72/76* (2026.01)
*B65G 47/90* (2006.01)
(Continued)

(52) U.S. Cl.
CPC .......... *H10P 72/7602* (2026.01); *B65G 47/90* (2013.01); *H10P 72/0606* (2026.01); *H10P 72/3202* (2026.01)

(58) Field of Classification Search
CPC ......... H01L 21/68707; H01L 21/67259; H01L 21/67706; H01L 21/67046;
(Continued)

(56) References Cited

U.S. PATENT DOCUMENTS

2004/0037691 A1* 2/2004 Woodruff .......... H01L 21/67265
414/744.5
2018/0001440 A1* 1/2018 Aono ................ H01L 21/68707
(Continued)

FOREIGN PATENT DOCUMENTS

JP 2000173966 6/2000
JP 2010050436 3/2010
(Continued)

*Primary Examiner* — Erin F Bergner
(74) *Attorney, Agent, or Firm* — JCIPRNET

(57) ABSTRACT

A cleaning and transfer equipment includes cleaning modules disposed in series, a wafer transport mechanism transporting a wafer between the cleaning modules, and a control device controlling an operation of the wafer transport mechanism. The wafer transport mechanism includes a wafer gripping mechanism gripping the wafer, a vertical moving mechanism vertically moving the wafer gripping mechanism, and an arrangement direction moving mechanism moving the wafer gripping mechanism in an arrangement direction of the cleaning modules. The wafer gripping mechanism includes a pair of hands openable and closeable, a rotation mechanism rotating the hands about a rotation shaft parallel to an opening/closing direction, and a sensor measuring a value corresponding to a weight applied to the hands when the hands are in a closed state. The control device compares measurement data of the sensor with a predetermined threshold value to determine whether the wafer is held on the hands.

11 Claims, 15 Drawing Sheets

(51) Int. Cl.
*H10P 72/00* (2026.01)
*H10P 72/30* (2026.01)

(58) Field of Classification Search
CPC ......... H01L 21/67051; H01L 21/67253; H01L 21/67288; H01L 21/67742; B65G 47/90; B65G 47/901
See application file for complete search history.

(56) References Cited

U.S. PATENT DOCUMENTS

| | | | | |
|---|---|---|---|---|
| 2019/0105770 | A1* | 4/2019 | Plaisted | H01L 21/67742 |
| 2019/0148209 | A1* | 5/2019 | Liu | H01L 21/68707 414/751.1 |

FOREIGN PATENT DOCUMENTS

| | | |
|---|---|---|
| JP | 2018006549 | 1/2018 |
| JP | 6727044 | 7/2020 |
| JP | 2023111109 | 8/2023 |

* cited by examiner

| Θ axis load torque | | Hand 1 | | |
|---|---|---|---|---|
| | | Presence of WF | Absence of WF | Difference |
| Number of times of measurement | 1 | −11.08 | −23.05 | 11.97 |
| | 2 | −11.08 | −23.22 | 12.14 |
| | 3 | −11.08 | −22.80 | 11.72 |
| | 4 | −11.09 | −23.02 | 11.93 |
| | 5 | −11.11 | −22.04 | 10.94 |
| | 6 | −11.08 | −23.13 | 12.05 |
| | 7 | −11.10 | −22.78 | 11.68 |
| | 8 | −11.07 | −23.23 | 12.16 |
| | 9 | −11.12 | −23.20 | 12.08 |
| | 10 | −11.10 | −22.80 | 11.70 |

FIG. 4

CLEANING AND TRANSFER EQUIPMENT, WAFER TREATMENT EQUIPMENT, TRANSFER EQUIPMENT, AND CLEANING AND TRANSFER METHODS

CROSS-REFERENCE TO RELATED APPLICATION

This application claims the priority benefit of Japan application serial no. 2023-077683, filed on May 10, 2023. The entirety of the above-mentioned patent application is hereby incorporated by reference herein and made a part of this specification.

BACKGROUND

Technical Field

The disclosure relates to a cleaning and transfer equipment, a wafer treatment equipment, a transfer equipment, and a cleaning and transfer method.

Description of Related Art

In recent years, as semiconductor devices have become more highly integrated, circuit wiring has become finer and a distance between wirings has become narrower. In the manufacture of semiconductor devices, a large number of types of materials are repeatedly formed in film shapes on a silicon wafer to form a layered structure. In order to form this laminated structure, a technique for flattening the surface of the wafer is important. As a means for flattening the surface of such a wafer, a polishing device (also referred to as a chemical mechanical polishing device) that performs chemical mechanical polishing (CMP) has been widely used.

A chemical mechanical polishing (CMP) device generally includes a polishing table to which a polishing pad is attached, a top ring that holds a wafer, and a nozzle that supplies polishing liquid (slurry) onto the polishing pad. While the polishing liquid is supplied onto the polishing pad from the nozzle, the top ring presses the wafer against the polishing pad, and the top ring and the polishing table are moved relative to each other to polish the wafer and flatten its surface.

In addition to such a CMP device, the wafer treatment equipment is a device that has a function of cleaning and further drying the polished wafer. Japanese Patent Laid-Open No. 2018-6549 proposes a configuration in which a plurality of cleaning modules are arranged in series as an example of a configuration of a cleaning unit that cleans a polished substrate.

In such a wafer treatment equipment, the applicant has already proposed a technique for installing an optical sensor in each cleaning module and determining whether a wafer is present on a stage based on the amount of light received by the optical sensor (Japanese Patent Application No. 2022-012769).

According to this technique, for example, when a wafer starts to be transported from a first cleaning module to a second cleaning module, it is assumed that the first cleaning module includes a wafer and the second cleaning module does not include a wafer, and it is determined that the first cleaning module includes a wafer and the second cleaning module does not include a wafer in a normal state as shown in FIG. 10A, based on detection results of the optical sensors of the cleaning modules. Thus, when comparing a state assumed at the start of transport with a state actually determined by the sensor, there is no contradiction therebetween, and thus it can be determined that the state is normal.

Furthermore, when the transport of the wafer from the first cleaning module to the second cleaning module is completed, it is assumed that the first cleaning module does not include a wafer and the second cleaning module includes a wafer, and it is determined that the first cleaning module does not include a wafer and the second cleaning module includes a wafer in a normal state as shown in 10B, based on detection results of the optical sensors of the cleaning modules. Thus, when comparing a state assumed at the time of completion of transport with a state actually determined by the sensor, there is no contradiction therebetween, and thus it can be determined that the state is normal.

On the other hand, as shown in FIG. 10C, a case where the wafer breaks in the first cleaning module and the optical sensor of the first cleaning module can receive light from a light emitting unit is considered. In this case, when the wafer starts to be transported from the first cleaning module to the second cleaning module, it is determined that the first cleaning module and the second cleaning module do not include a wafer based on detection results of the optical sensors of the cleaning modules. Thus, when comparing a state assumed at the start of transport with a state actually determined by the sensor, there is a contradiction therebetween, and thus it can be determined that the state is abnormal.

Further, as shown in FIG. 10D, a case where the wafer breaks in the first cleaning module, but the optical sensor of the first cleaning module cannot receive light from the light emitting unit is considered. In this case, when the transport of the wafer from the first cleaning module to the second cleaning module is completed, it is determined that the first cleaning module includes a wafer and the second cleaning module does not include a wafer based on detection results of the optical sensors of the cleaning modules. Thus, when comparing a state assumed at the time of completion of transport with a state actually determined by the sensor, there is a contradiction therebetween, and thus it can be determined that the state is abnormal.

However, in the above-described method, whether the state is abnormal can only be confirmed at the start of transport or at the completion of transport, and cannot be confirmed during transport. Furthermore, when the wafer falls off a hand of a wafer transport mechanism for some reason during transport, this fact will only be known when the wafer is transported to the next cleaning module (when transport is completed).

When a plurality of processing modules are individually processed while sequentially moving a plurality of wafers, the fact that a wafer has fallen off during transport may be confirmed at the timing of moving to the next processing, which will affect the transfer and processing of wafers before and after the wafer that has fallen off, and in some cases, the wafers themselves before and after the wafer that has fallen off may become unusable. Furthermore, on the assumption that it is desired to improve efficiency by shortening a wafer processing time, obstruction to efficiency due to such a delay in noticing is a problem.

The disclosure provides a cleaning and transfer equipment that can confirm that a wafer is held on a hand of a wafer transport mechanism even during transport of the wafer, a wafer treatment equipment, a transfer equipment, and a cleaning method.

SUMMARY

A cleaning and transfer equipment according to an aspect of the disclosure includes a plurality of cleaning modules that are disposed in series, a wafer transport mechanism that transports a wafer between the plurality of cleaning modules, and a control device that controls an operation of the wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the control device compares measurement data of the sensor with a predetermined threshold value to determine whether the wafer is held on the pair of hands.

A wafer treatment equipment according to another aspect of the disclosure includes a polishing unit that polishes a wafer, and a cleaning unit that cleans the wafer after polishing, in which the cleaning unit includes the cleaning and transfer equipment according to the first or second aspect.

A transfer equipment according to yet another aspect of the disclosure includes a wafer transport mechanism that transports a wafer between a plurality of cleaning modules disposed in series, and a control device that controls an operation of the wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the control device compares measurement data of the sensor with a predetermined threshold value to determine whether the wafer is held on the pair of hands.

A cleaning and transfer method according to still another aspect of the disclosure includes cleaning a wafer by a plurality of cleaning modules disposed in series, and transporting the wafer between the plurality of cleaning modules by a wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the transporting of the wafer includes comparing measurement data of the sensor with a predetermined threshold value to determine whether the wafer is held on the pair of hands.

BRIEF DESCRIPTION OF THE DRAWINGS

FIG. 4 is a table showing measurement data of a torque sensor when a wafer is gripped by a hand and when it is not gripped by the hand.

DESCRIPTION OF THE EMBODIMENTS

Figure 1:
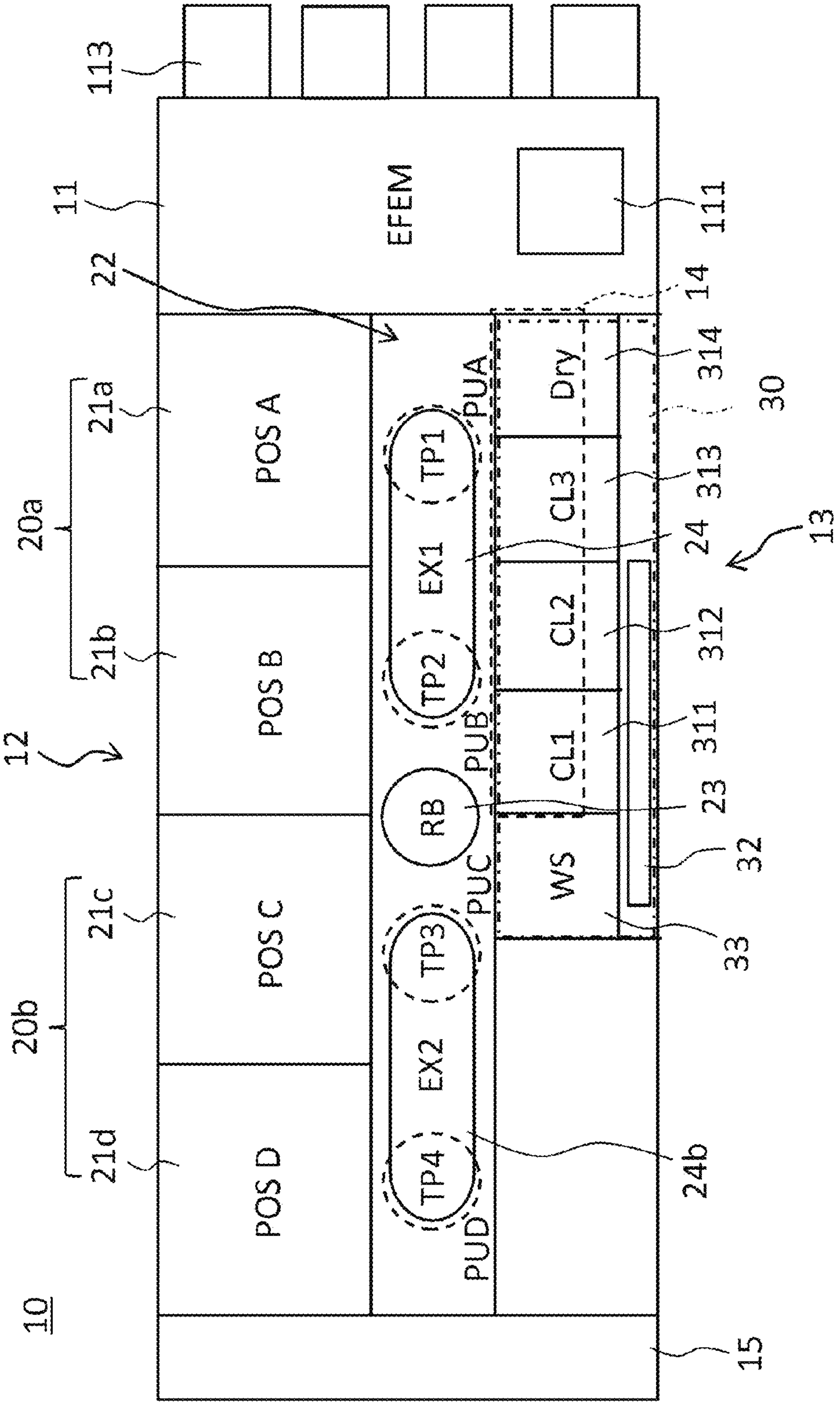
FIG. 1 is a plan view showing the overall configuration of a wafer treatment equipment according to an embodiment.

A cleaning and transfer equipment according to a first aspect of the disclosure includes a plurality of cleaning modules that are disposed in series, a wafer transport mechanism that transports a wafer between the plurality of cleaning modules, and a control device that controls an operation of the wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the control device compares measurement data of the sensor with a predetermined threshold value to determine whether the wafer is held on the pair of hands.

According to such an aspect, the sensor that measures a value corresponding to a weight applied to the pair of hands when the pair of hands are in a closed state are provided in the wafer gripping mechanism that is moved by the vertical moving mechanism and the arrangement direction moving mechanism, and thus it is possible to determine whether the wafer is held on the pair of hands even during the operation of the vertical moving mechanism and the arrangement direction moving mechanism (during transport of the wafer). Thereby, it is possible to rapidly detect and cope with transport errors. Further, it is possible to track position information of the wafer being transported.

A cleaning and transfer equipment according to a second aspect of the disclosure is the cleaning and transfer equipment according to the first aspect, in which the control device stops an operation of the wafer transport mechanism when it is determined that the wafer is not held on the pair of hands.

According to such an aspect, an operation is immediately stopped when an abnormality occurs, and thus it is possible to contribute to reducing downtime of the device.

A cleaning and transfer equipment according to a third aspect of the disclosure is the cleaning and transfer equipment according to the first or second aspect, in which the sensor is a torque sensor that measures a load torque of a servo motor included in the rotation mechanism.

A cleaning and transfer equipment according to a fourth aspect of the disclosure is the cleaning and transfer equipment according to the first or second aspect, in which the sensor is a displacement sensor that measures relative height positions of tip ends of the pair of hands with respect to base ends.

A cleaning and transfer equipment according to a fifth aspect of the disclosure is the cleaning and transfer equipment according to the first or second aspect, in which the pair of hands include a hand main body, a hook disposed to be suspended below the hand main body, and an elastic member that elastically supports the hook with respect to the hand main body, and the sensor is a proximity sensor that is disposed on the hand main body and detects approaching or separation of the hook.

A cleaning and transfer equipment according to a sixth aspect of the disclosure is the cleaning and transfer equipment according to the first or second aspect, in which the sensor includes a torque sensor that measures a load torque of a servo motor included in the rotation mechanism, and a displacement sensor that measures relative height positions of tip ends of the pair of hands with respect to base ends.

A cleaning and transfer equipment according to a seventh aspect of the disclosure is the cleaning and transfer equipment according to the first or second aspect, in which the pair of hands include a hand main body, a hook disposed to be suspended below the hand main body, and an elastic member that elastically supports the hook with respect to the hand main body, and the sensor includes either one or both of a torque sensor that measures a load torque of a servo motor included in the rotation mechanism and a displacement sensor that measures relative height positions of tip ends of the pair of hands with respect to base ends, and a proximity sensor that is disposed on the hand main body and detects approaching or separation of the hook.

A cleaning and transfer equipment according to an eighth aspect of the disclosure is the cleaning and transfer equipment according to any one of the first to seventh aspects, in which the control device compares the measurement data of the sensor with a second threshold value different from the threshold value to estimate a state of the wafer held on the pair of hands.

A cleaning and transfer equipment according to a ninth aspect of the disclosure is the cleaning and transfer equipment according to the eighth aspect, in which the state of the wafer is any of whether the wafer is cantilevered by only one of the pair of hands, whether the wafer is broken, whether there is a predetermined amount of water droplets on the wafer, and whether a wear amount of a wafer for evaluation exceeds a predetermined value, and whether the wafer is an abnormal individual.

A cleaning and transfer equipment according to a tenth aspect of the disclosure is a cleaning and transfer equipment according to any one of the first to ninth aspects, in which the control device performs a device failure diagnosis by counting the number of times the measurement data of the sensor exceeds the threshold value.

A cleaning and transfer equipment according to an eleventh aspect of the disclosure is a cleaning and transfer equipment according to any one of the first to tenth aspects, in which the control device detects an abnormality by confirming fluctuations in the measurement data of the sensor while the wafer gripping mechanism is being moved by the vertical moving mechanism and the arrangement direction moving mechanism.

A wafer treatment equipment according to a twelfth aspect of the disclosure includes a polishing unit that polishes a wafer, and a cleaning unit that cleans the wafer after polishing, in which the cleaning unit includes the cleaning and transfer equipment according to the first or second aspect.

A transfer equipment according to a thirteenth aspect of the disclosure includes a wafer transport mechanism that transports a wafer between a plurality of cleaning modules disposed in series, and a control device that controls an operation of the wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the control device compares measurement data of the sensor with a predetermined threshold value to determine whether the wafer is held on the pair of hands.

A cleaning and transfer method according to a fourteenth aspect of the disclosure includes cleaning a wafer by a plurality of cleaning modules disposed in series, and transporting the wafer between the plurality of cleaning modules by a wafer transport mechanism, in which the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the transporting of the wafer includes comparing measurement data of the sensor with a predetermined threshold value to determine whether the wafer is held on the pair of hands.

An embodiment of the disclosure will be described in detail below with reference to the accompanying drawings. In the following description and drawings used in the following description, the same reference numerals are used for parts that have the same configuration, and repeated description will be omitted.

Configuration of Substrate Processing Device

FIG. 1 is a plan view showing the overall configuration of a wafer treatment equipment according to an embodiment. As shown in FIG. 1, a wafer treatment equipment 10 includes a housing that is substantially rectangular in plan view, and the inside of the housing is partitioned into a loading/unloading unit 11, a polishing unit 12, a cleaning unit 13, and a transport unit 14. The loading/unloading unit 11, the polishing unit 12, the cleaning unit 13, and the transport unit 14 are independently assembled and independently evacuated. Further, the wafer treatment equipment 10 is provided with a control unit 15 (also referred to as a control device) that controls operations of the loading/unloading unit 11, the polishing unit 12, the cleaning unit 13, and the transport unit 14.

Among these, the loading/unloading unit 11 includes a plurality of (four in the illustrated example) front loading units 113 on which a wafer cassette for stocking a large number of wafers (substrates) W is placed, and a transport robot 111 that is movable in an arrangement direction (in the illustrated example, the width direction of the substrate processing device 10) of the front loading units 113. As a specific configuration of the loading/unloading unit 11, for example, a configuration described in Japanese Patent No. 6727044 can be adopted. The transport robot 111 takes out an unpolished wafer W from the wafer cassette on the front load unit 113 and transports it to the transport unit 14, which will be described later, and also takes out the wafer W after cleaning and drying from the cleaning unit 13, which will be described later, and returns it to the wafer cassette.

The transport unit 14 is a region for transporting an unpolished wafer W from the loading/unloading unit 11 to the polishing unit 12, and is provided to extend in the longitudinal direction of the substrate processing device 10. The transport unit 14 includes a slide stage (not shown) that holds the wafer W, and a stage moving mechanism (not shown) that linearly moves the slide stage in the longitudinal direction. As a specific configuration of the transport unit 14, for example, a configuration described in Japanese Patent No. 6727044 can be adopted. The unpolished wafer W transferred from the transport robot 111 of the loading/unloading unit 11 to the transport unit 14 is placed on the slide stage and moved to a position that can be accessed by a transport robot 23 of the polishing unit 14, which will be described later.

The polishing unit 12 is a region where wafers W are polished, and includes a first polishing unit 20*a* having a first polishing device 21*a* and a second polishing device 21*b*, a second polishing unit 20*b* including a third polishing device 21*c* and a fourth polishing device 21*d*, and a polishing unit transport mechanism 22 disposed adjacent to the transport unit 14, and each of the first polishing unit 20*a* and the second polishing unit 20*b*. As a specific configuration of the polishing unit 12, for example, a configuration described in Japanese Patent No. 6727044 can be adopted. The first polishing device 21*a*, the second polishing device 21*b*, the third polishing device 21*c*, and the fourth polishing device 21*d* are arranged in the longitudinal direction of the substrate processing device 10, and the polishing unit transport mechanism 22 is disposed between the cleaning unit 13, the first polishing unit 20*a* and the second polishing unit 20*b* in the width direction of the substrate processing device 10.

The polishing unit transport mechanism 22 includes a first transport unit 24*a* that transports the wafer W to the first polishing unit 20*a*, a second transport unit 24*b* that transports the wafer W to the second polishing unit 20*b*, and a transport robot 23 that is disposed between the first transport unit 24*a* and the second transport unit 24*b* and transfers wafers between the transport unit 14, the first transport unit 24*a*, and the second transport unit 24*b*. In the illustrated example, the transport robot 23 is disposed approximately at the center of the housing of the substrate processing device 10.

The unpolished wafers W that are continuously transported from the transport unit 14 to the polishing unit 12 are distributed to the first transport unit 24*a* and the second transport unit 24*b* by the transport robot 23. Then, the wafers W distributed to the first transport unit 24*a* are carried into the first polishing unit 20*a* and are polished and processed by the polishing device 21*a* and/or 21*b* of the first polishing unit 20*a*. Further, the wafers W distributed to the second transport unit 24*b* are carried into the second polishing unit 20*b* and are polished and processed by the polishing devices 21*c* and/or 21*d* of the second polishing unit 20*b*.

The wafers W polished and processed by the polishing devices 21*a* and 21*b* of the first polishing unit 20*a* are transferred from the first polishing unit 20*a* to the first transport unit 24*a*, and then taken out from the first transport unit 24*a* by the transport robot 23 and transported to the wafer station 33 of the cleaning unit 13, which will be described later. Similarly, the wafers W polished and processed by the polishing devices 21*c* and 21*d* of the second polishing unit 20*b* are transferred from the second polishing unit 20*b* to the second transport unit 24*b*, and then taken out from the second transport unit 24*b* by the transport robot 23 and transported to the wafer station 33 of the cleaning unit 13, which will be described later.

The cleaning unit 13 is a region for cleaning polished wafers. In the example shown in FIG. 1, the cleaning unit 13 and the transport unit 14 are arranged to overlap in a vertical direction, which provides an advantage of a small footprint.

As shown in FIG. 1, the cleaning unit 13 includes a cleaning and transfer equipment 30 that includes a plurality of (four in the illustrated example) cleaning modules 311, 312, 313, and 314, the wafer station 33, and a wafer transport mechanism 32 that transports wafers W between the cleaning modules 311 to 314 and the wafer station 33. As a specific configuration of the wafer station 33, for example, a configuration described in Japanese Patent No. 6727044 can be adopted.

In the illustrated example, four cleaning modules 311 to 314 (hereinafter may referred to as primary to quaternary cleaning modules) are arranged in series in this order from the wafer station 33. Each of the cleaning modules 311 to 314 includes a cleaning machine (not shown) and a housing 91 (see FIGS. 3A to 3E) that covers the cleaning machine.

As the cleaning machines of the primary cleaning module 311 and the secondary cleaning module 312, it is possible to use, for example, a roll type cleaning machine that cleans the front and back surfaces of a wafer by rotating roll-shaped sponges disposed at the top and bottom of the cleaning machine and pressing them against the front and back surfaces of the wafer. Further, as the cleaning machine of the tertiary cleaning module 313, it is possible to use, for example, a pencil type cleaning machine that cleans by pressing a hemispherical sponge against a wafer while rotating it (for example, a device disclosed in FIG. 10 and the like in Japanese Patent Laid-Open No. 2000-173966). As the cleaning machine of the quaternary cleaning module 314, it is possible to use, for example, a pencil type cleaning machine that can rinse the back surface of a wafer and cleans the front surface of the wafer by pressing a hemispherical sponge against the wafer while rotating it. The cleaning machine of the quaternary cleaning module 314 includes a stage that rotates a chucked wafer at high speed, and has a function (spin dry function) of drying a cleaned wafer by rotating the wafer at high speed. As a modification example, the quaternary cleaning module 314 may include an IPA drying device (for example, a device disclosed in FIGS. 33 to 39 in Japanese Patent Laid-Open No. 2010-50436) that sprays IPA (isopropyl alcohol) vapor onto the front surface of the wafer W to dry it while rotating the wafer W. In the cleaning machines of the cleaning modules 311 to 314, a megasonic type cleaning machine that cleans by applying ultrasonic waves to a cleaning liquid may be additionally provided, in addition to the roll type cleaning machine and pencil type cleaning machine described above.

Similarly to the housing of the wafer station 33, the housing of each of the cleaning modules 311 to 314 includes a bottom plate, four side plates, and a top plate. Among the four side plates, an arm passage opening 94 for making a hand of the wafer transport mechanism 32 pass is formed in the side plate facing the wafer transport mechanism 32 and the left and right side plates (sec FIGS. 3A to 3E). The arm passage opening 94 can be opened and closed by a shutter 97. The arm passage opening 94 is formed at the same height as the arm passage opening of the wafer station 33. The wafer transport mechanism 32 can access the inside of the housing 91 through the arm passage opening 94.

Figure 2:
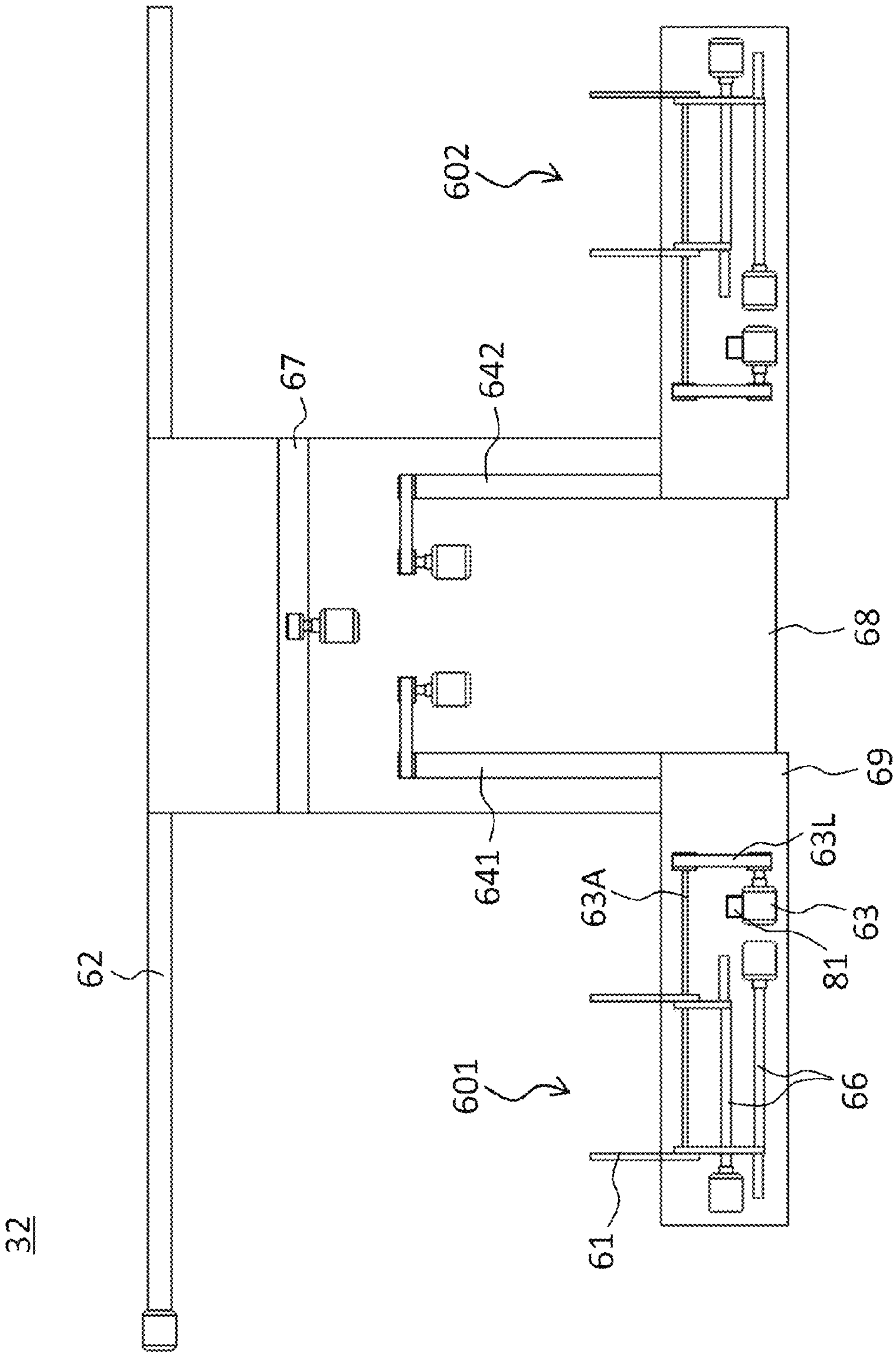
FIG. 2 is an internal rear view showing a configuration of a wafer transport mechanism in a cleaning unit of the wafer treatment equipment shown in FIG. 1.

FIG. 2 is an internal rear view showing a configuration of the wafer transport mechanism 32. As shown in FIG. 2, the wafer transport mechanism 32 includes a first wafer gripping mechanism 601 and a second wafer gripping mechanism 602 that grip the wafer W, a first vertical moving mechanism 641 and a second vertical moving mechanism 642 that vertically move the first wafer gripping mechanism 601 and the second wafer gripping mechanism 602, respectively, and an arrangement direction moving mechanism 62 that moves the first wafer gripping mechanism 601 and the second wafer gripping mechanism 602 in the arrangement direction of the plurality of cleaning modules 311 to 314. That is, in the present embodiment, the number of wafer gripping mechanisms 601 and 602 is smaller than the number of cleaning modules 311 to 314.

In the present embodiment, the first wafer gripping mechanism 601 and the second wafer gripping mechanism 602 can be used selectively depending on, for example, the cleanliness of the wafer W. For example, among the primary to quaternary cleaning modules 311 to 314, the first wafer gripping mechanism 601 is used in the primary cleaning module 311 and the secondary cleaning module 312 in the first half of cleaning processing, and the second wafer gripping mechanism 602 is used in the tertiary cleaning module 313 and the quaternary cleaning module 314 in the latter half of the cleaning processing, whereby it is possible to prevent a wafer W in the latter half of the cleaning processing from coming into contact with the first wafer gripping mechanism 601 and being contaminated.

As the arrangement direction moving mechanism 62, for example, a motor drive mechanism using a ball screw is used. As shown in FIG. 2, the ball screw of the arrangement direction moving mechanism 62 is provided above the cleaning modules 311 to 314 to extend in the arrangement direction of the cleaning modules 311 to 314.

A main frame 68 is attached to the ball screw of the arrangement direction moving mechanism 62. The main frame 68 is attached to be suspended downward from the ball screw of the arrangement direction moving mechanism 62 and faces the side surfaces of the cleaning modules 311 to 314. The main frame 68 is linearly moved in the arrangement direction of the cleaning modules 311 to 314 while facing the side surfaces of the cleaning modules 311 to 314 by driving of a motor connected to the ball screw of the arrangement direction moving mechanism 62.

In the illustrated example, the main frame 68 includes a depth direction moving mechanism 67 for adjusting the position thereof in the depth direction (a direction perpendicular to both the arrangement direction of the cleaning modules 311 to 314 and the vertical direction). As the depth direction moving mechanism 67, for example, a motor drive mechanism using a rack and pinion is used. The position of the main frame 68 in the depth direction is adjusted by driving of the depth direction moving mechanism 67.

The first vertical moving mechanism 641 and the second vertical moving mechanism 642 are provided on the main frame 68. As the first vertical moving mechanism 641 and the second vertical moving mechanism 642, for example, a motor drive mechanism using a ball screw is used. As shown in FIG. 2, the ball screw of the first vertical moving mechanism 641 is attached to a left end of the main frame 68 to extend in the vertical direction, and the ball screw of the second vertical moving mechanism 642 is attached to a right end of the main frame 68 to extend in the vertical direction.

A sub-frame 69 that supports the first wafer gripping mechanism 601 is attached to the ball screw of the first vertical moving mechanism 641. The sub-frame 69 is provided on the left side of the main frame 68 to be adjacent to the main frame 68 and faces the side surfaces of the cleaning modules 311 to 314. The first wafer gripping mechanism 601 provided on the sub-frame 69 is linearly moved in the vertical direction by driving of a motor connected to the ball screw of the first vertical moving mechanism 641.

Similarly, the sub-frame 69 that supports the second wafer gripping mechanism 602 is attached to the ball screw of the second vertical moving mechanism 642. The sub-frame 69 is provided on the right side of the main frame 68 to be adjacent to the main frame 68, and can face the side surfaces of the cleaning modules 311 to 314. The second wafer gripping mechanism 602 provided on the sub-frame 69 is linearly moved in the vertical direction by driving of a motor connected to the ball screw of the second vertical moving mechanism 642.

Since the first wafer gripping mechanism 601 and the second wafer gripping mechanism 602 have substantially the same structure except that they are symmetrical with respect to the main frame 68, the first wafer gripping mechanism 601 will be described below.

As shown in FIG. 2, the first wafer gripping mechanism 601 includes a pair of openable hands 61 that grip a wafer, a rotation mechanism 63 that rotates the pair of hands 61 about a rotation shaft 63A parallel to an opening/closing direction, and an opening/closing mechanism 66 that opens and closes the pair of hands 61 in a direction in which they approach each other or in a direction in which they move away from each other.

As shown in FIG. 2, the pair of hands 61 are arranged in parallel to each other, and the base ends of the hands 61 are attached to the rotation shaft 63A rotatably provided on the sub-frame 69. Furthermore, the rotation mechanism 63 that rotates the pair of hands 61 about the rotation shaft 63A is provided on the sub-frame 69. As the rotation mechanism 63, for example, a motor drive mechanism (servo motor) is used. The rotation shaft of the rotation mechanism 63 is connected to the rotation shaft 63A via a link member 63L. The rotational force of the second rotation mechanism 63 is transmitted to the rotation shaft 63A via the link member 63L, and the pair of hands 61 are rotated about the rotation shaft 63A.

Furthermore, the opening/closing mechanism 66 that opens and closes the pair of hands 61 in a direction in which they approach each other or in a direction in which they move away from each other is provided on the sub-frame 69. As the opening/closing mechanism 66, for example, an air cylinder is used. When the pair of hands 61 are closed by the opening/closing mechanism 66, the pair of hands 61 sandwich and hold the peripheral edge of the wafer W.

Next, an example of an operation of the pair of hands 61 will be described with reference to FIGS. 3A to 3E. As described above, each of the cleaning modules is partitioned by the housing 91 to prevent a used fluid from scattering to the outside during cleaning of the wafer W, and an arm passage opening 94 is formed on the side surface of the housing 91. The arm passage opening 94 is provided with a shutter 97 that is openable and closeable.

Figure 3A:
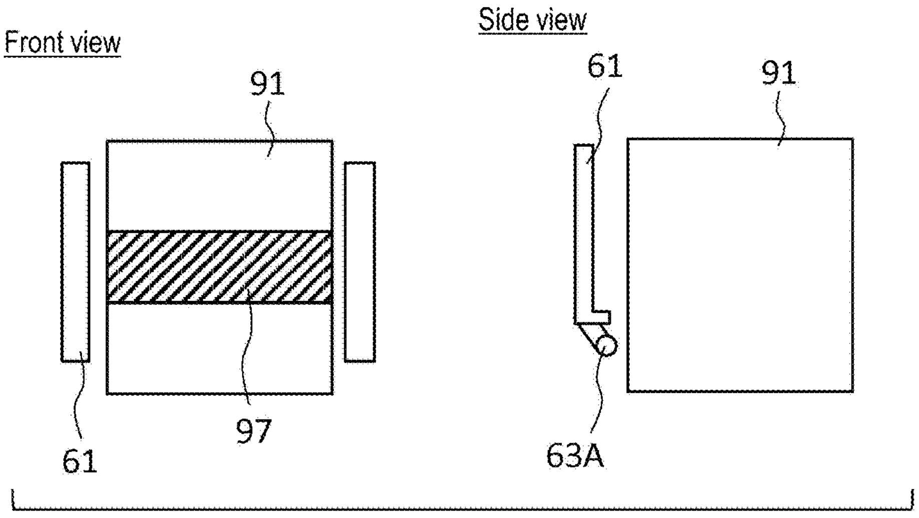
FIG. 3A is a schematic diagram showing an example of an operation of the wafer transport mechanism shown in FIG. 2.

When the cleaned wafer W is taken out from the housing 91, the pair of hands 61 with tips facing upward are moved to a standby position adjacent to the housing 91 by driving of the arrangement direction moving mechanism 62 as shown in FIG. 3A. In the present embodiment, even when the shutter 97 of the housing 91 is closed, the pair of hands 61 can be moved to the standby position adjacent to the housing 91 by making the tips of the pair of hands 61 face upward. Thus, the start timing of the wafer take-out operation can be made earlier, and the throughput of the entire processing can be improved.

Figure 3B:
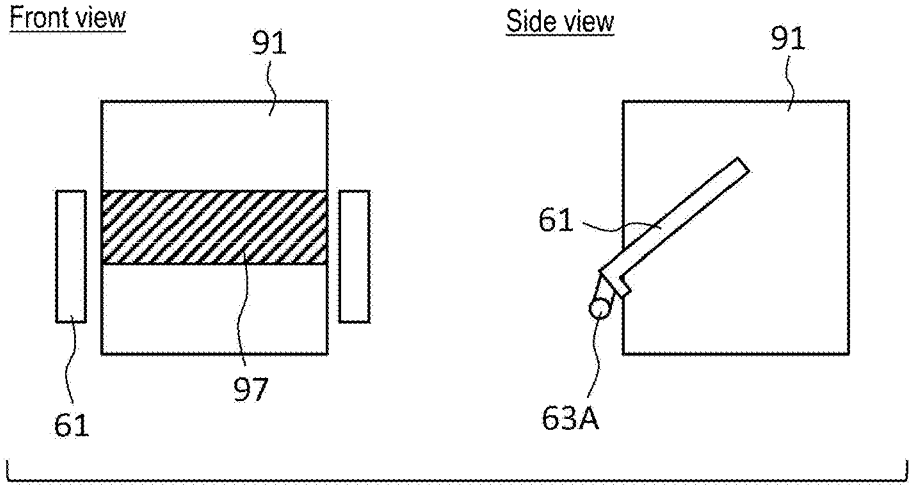
FIG. 3B is a schematic diagram showing an example of an operation of the wafer transport mechanism shown in FIG. 2.
Figure 3C:
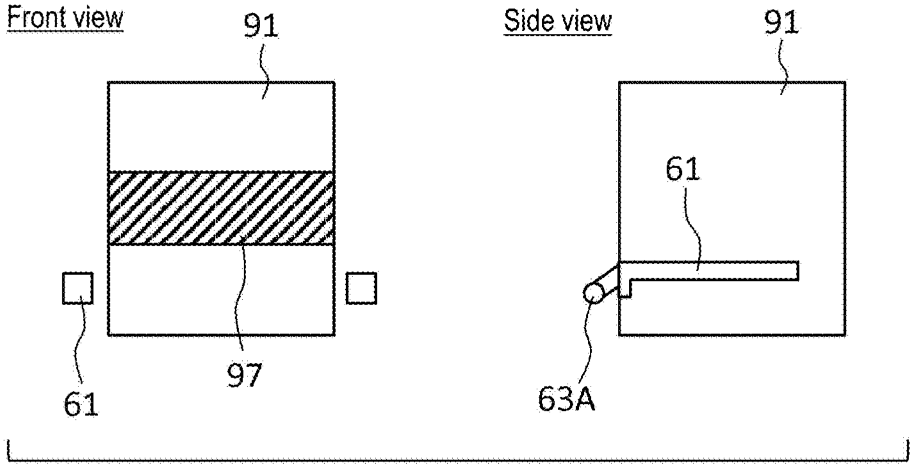
FIG. 3C is a schematic diagram showing an example of an operation of the wafer transport mechanism shown in FIG. 2.

Next, as shown in FIGS. 3B and 3C, the pair of hands 61 are rotated about the rotation shaft 63A by driving of the rotation mechanism 63. In the illustrated example, the pair of hands 61 are rotated clockwise by 90 degrees around the rotation shaft 63A when viewed from the side, and the tips of the pair of hands 61 are oriented sideways.

Figure 3D:
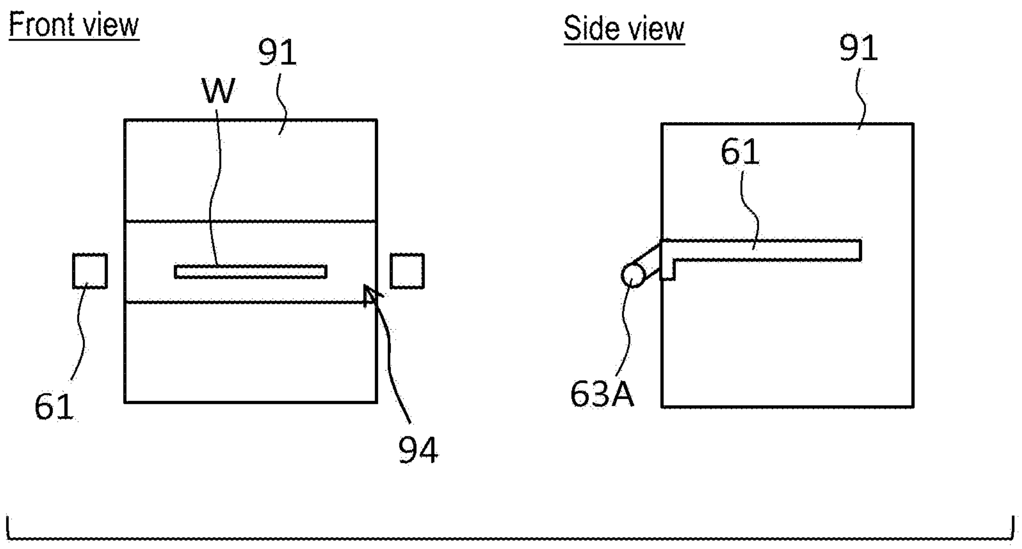
FIG. 3D is a schematic diagram showing an example of an operation of the wafer transport mechanism shown in FIG. 2.

Next, as shown in FIG. 3D, the pair of hands 61 are raised to the same height position as the arm passage opening 94 by driving of the vertical moving mechanism 641. At this time, the shutter 97 is retracted and the arm passage opening 94 is opened.

Figure 3E:
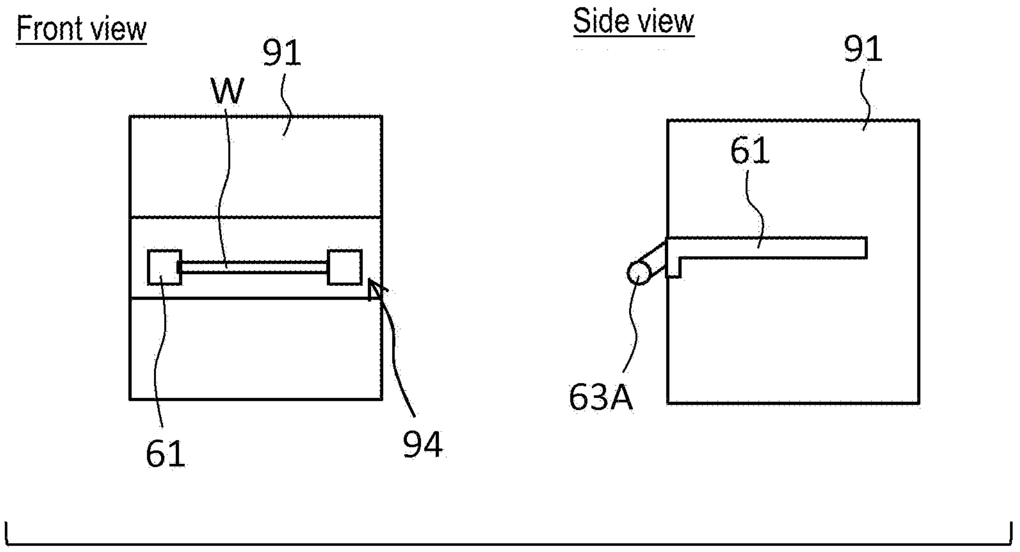
FIG. 3E is a schematic diagram showing an example of an operation of the wafer transport mechanism shown in FIG. 2.

Next, as shown in FIG. 3E, the pair of hands 61 are closed in a direction in which they approach each other by driving of the opening/closing mechanism 662, are inserted into the housing 91 through the arm passage opening 94, and grip the wafer W inside the housing 91. Then, the pair of hands 61 that grip the wafer W are moved to the next cleaning module by driving of the arrangement direction moving mechanism 62.

When the wafer W before cleaning is carried into the housing 91, the above-described operations shown in FIGS. 3A to 3E are performed in the reverse order. That is, as shown in FIG. 3E, the pair of hands 61 gripping the wafer W are moved into the housing 91 through the arm passage opening 94 by driving of the arrangement direction moving mechanism 62.

Next, as shown in FIG. 3D, the pair of hands 61 are opened in a direction in which they move away from each other by driving of the opening/closing mechanism 66, and are taken out of the housing 91 through the arm passage opening 94.

Next, as shown in FIG. 3C, the pair of hands 61 are lowered to a height position lower than the arm passage opening 94 by driving of the vertical moving mechanism 641. At this time, the arm passage opening 94 is opened by the shutter 97, and cleaning processing of the wafer W is started inside the housing 91.

Next, as shown in FIGS. 3B and 3A, the pair of hands 61 are rotated about the rotation shaft 63A by driving of the rotation mechanism 63. In the illustrated example, the pair of hands 61 are rotated counterclockwise by 90 degrees about the rotation shaft 63A when viewed from the side, and the tips of the pair of hands 61 are oriented upward. Then, the pair of j hands 61 with tips facing upward are moved to the next cleaning module by driving of the arrangement direction moving mechanism 62. In the present embodiment, when the rotation mechanism 63 rotates the pair of hands 61 so that the tips thereof face upward, the vertical moving mechanism 641 lowers the pair of hands 61, and thus a space required above the pair of hands 61 can be reduced.

As shown in FIG. 2, in the present embodiment, the first wafer gripping mechanism 601 and the second wafer gripping mechanism 602 are disposed in a suspended manner below the arrangement direction moving mechanism 62. Thereby, a maintenance space for the first wafer gripping mechanism 601 and the second wafer gripping mechanism 602 is enlarged. Thus, a period of time required for maintenance can be reduced.

In the present embodiment, each of the first wafer gripping mechanism 601 and the second wafer gripping mechanism 602 is provided with a sensor 81 that measures a value corresponding to a weight applied to the pair of hands 61 when the pair of hands 61 are in a closed state. In the example shown in FIG. 2, the sensor 81 is a torque sensor that measures a load torque of a servo motor included in the rotation mechanism 63.

FIG. 4 is a table showing measurement data of the torque sensor 81 measured when the wafer W is held on the hands 61 and when the wafer W is not held on the hands 61, as a specific example according to the present embodiment.

As shown in FIG. 4, according to actual verification performed by the inventors of the disclosure, it can be understood that the load torque applied to the servo motor of the rotation mechanism 63 has fluctuated by approximately 10% or more between when the wafer W is held on the hands 61 and when the wafer W is not held on the hands 61. Thus, the torque sensor 81 that measures a load torque of the servo motor included in the rotation mechanism 63 can be used as a sensor that measures a value corresponding to a weight applied to the pair of hands 61 when the pair of hands 61 is in a closed state.

In the present embodiment, a control device 15 compares measurement data of the sensor 81 with a predetermined threshold value (hereinafter also referred to as a first threshold value) to determine whether the wafer W is held on the pair of hands 61.

For example, in the example shown in FIG. 4, the control device 15 stores a load torque (for example, −23% in the example shown in FIG. 4) when the wafer W is held on the hands 61, as a first threshold value. Then, when the hands 61 are in a closed state, the control device 15 compares measurement data of the torque sensor 81 with the first threshold value (−23%) stored in advance, determines that the wafer W is held on the hands 61 when a difference is less than a predetermined value (for example, 5%), and determines that the wafer W is not held on the hands 61 when the difference is equal to or greater than the predetermined value.

In the present embodiment, the sensor 81 that measures a value corresponding to a weight applied to the pair of hands 61 when the pair of hands 61 is in a closed state is provided in the wafer gripping mechanisms 601 and 602 that are moved by the vertical moving mechanisms 651 and 652 and the arrangement direction moving mechanism 62, and thus it is possible to determine whether the wafer W is held on the pair of hands 61 even during the operation of the vertical moving mechanisms 651 and 652 and the arrangement direction moving mechanism 62 (during transport of the wafer W).

Figure 5:
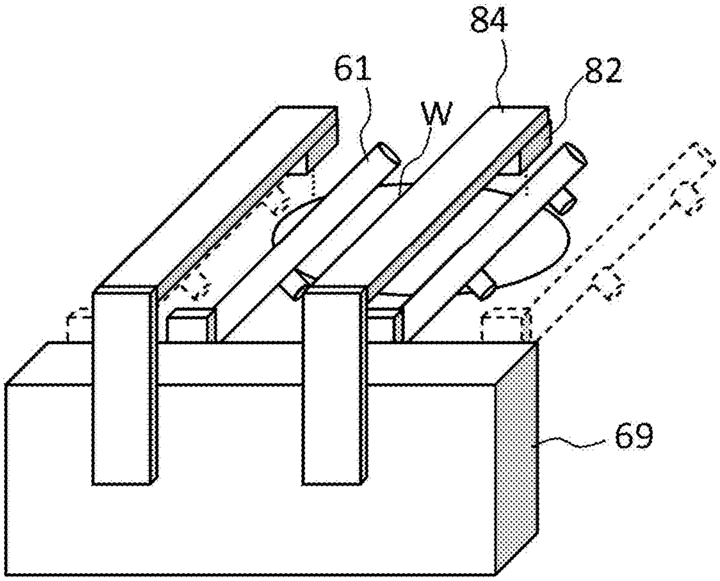
FIG. 5 is a perspective view showing a configuration of a wafer gripping mechanism including a displacement sensor.

As a modification example, as shown in FIG. 5, a bracket 84 extending in parallel to the pair of hands 61 above the pair of hands 61 is attached to the sub-frames 69 of the first wafer gripping mechanism 601 and the second wafer gripping mechanism 602, and a tip end of the bracket 84 may be provided with a displacement sensor 82 that measures relative height positions of tip ends of the pair of hands 61 with respect to base ends thereof when the pair of hands 61 is in a closed state.

In the example shown in FIG. 5, when the wafer W is not held on the pair of hands 61, the tip ends of the pair of hands 61 are at the same height as the base ends. On the other hand, when the wafer W is held on the pair of hands 61, the pair of hands 61 bend (curve) in accordance with the weight of the wafer W, and thus the tip ends of the pair of hands 61 fall below the base ends. Thus, it can be understood that the relative height positions of the tip ends of the pair of hands 61 with respect to the base ends fluctuate when the wafer W is held on the hands 61 and when the wafer W is not held on the hands 61. Thus, when the pair of hands 61 is in a closed state, the displacement sensor 82 that measures the relative height positions of the tip ends of the pair of hands 61 with respect to the base ends of the pair of hands 61 can be used as a sensor that measures a value corresponding to a weight applied to the pair of hands 61.

Figure 6A:
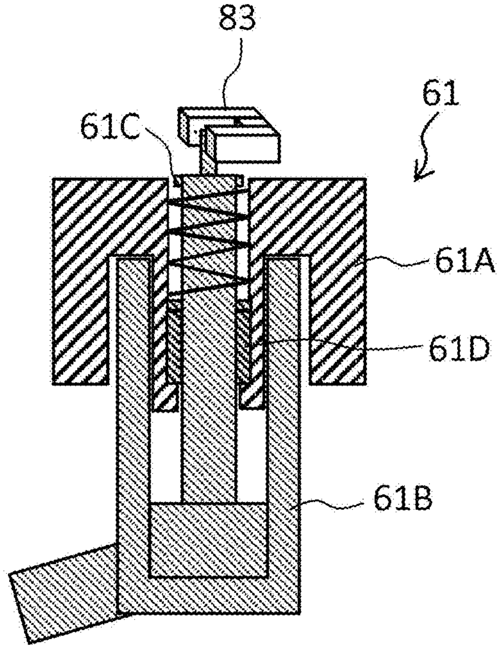
FIG. 6A is an enlarged internal side view showing a configuration of a wafer gripping mechanism including a proximity sensor.
Figure 6B:
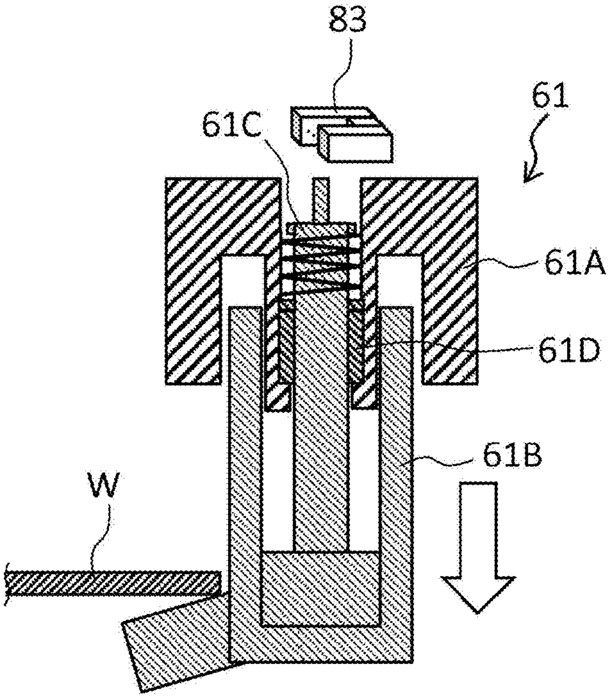
FIG. 6B is an enlarged internal side view showing a configuration of the wafer gripping mechanism including the proximity sensor.

As another modification example, as shown in FIGS. 6A and 6B, the pair of hands 61 include a hand main body 61A, a hook 61B disposed to be suspended below the hand main body 61A via a bush 61D, and an elastic member 61C (for example, a spring) that elastically supports the hook 61B with respect to the hand main body 61A, and a proximity sensor 83 (for example, a photomicro sensor) that detects approaching or separation of the hook 61B may be disposed on the hand main body 61A.

As shown in FIG. 6A, when the wafer W is not held on the pair of hands 61, the upper end of the hook 61B is close to the proximity sensor 83 and falls within its detection range. On the other hand, as shown in FIG. 6B, when the wafer W is held on the pair of hands 61, the elastic member 61C contracts in accordance with the weight of the wafer W, and thus the hook 61B moves downward, whereby the upper end of the hook 61B separates from the proximity sensor 83 and falls outside its detection range. Thus, it can be understood that a detection result obtained by the proximity sensor 83 fluctuates between when the wafer W is held on the hands 61 and when the wafer W is not held. Thus, the proximity sensor 83, which is disposed on the main body of the hand 61A and detects approaching or separation of the hook 61B, can be used as a sensor that measures a value corresponding to a weight applied to the pair of hands 61.

As still another modification example, the sensor that measures a value corresponding to a weight applied to the pair of hands 61 may include two or more types of sensors among the torque sensor 81, the displacement sensor 82, and the proximity sensor 83 described above. In this case, the wafer W can be monitored with higher precision.

Figure 8B:
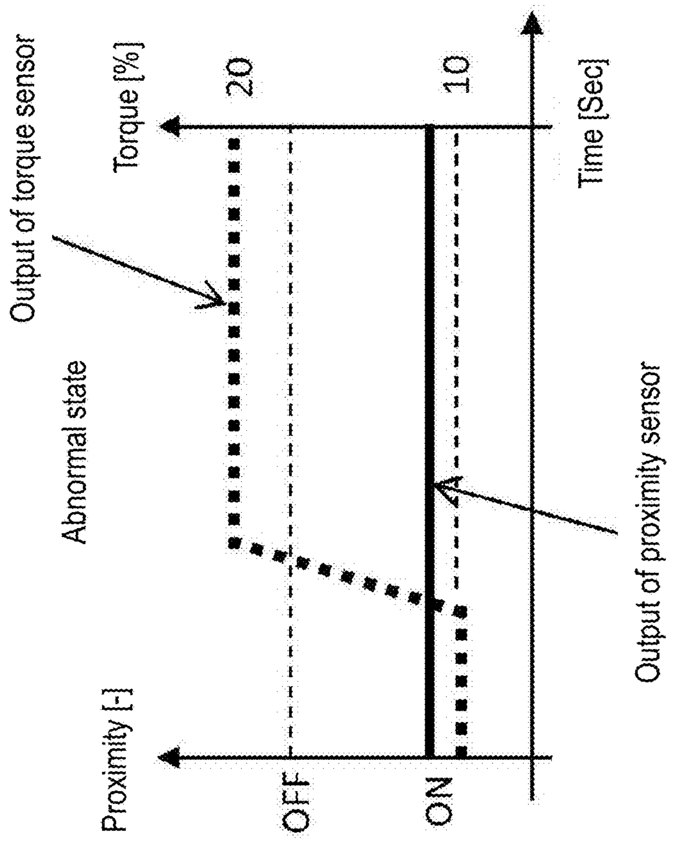
FIG. 8B is a graph showing measurement data of the torque sensor and the proximity sensor in an abnormal state.
Figure 8A:
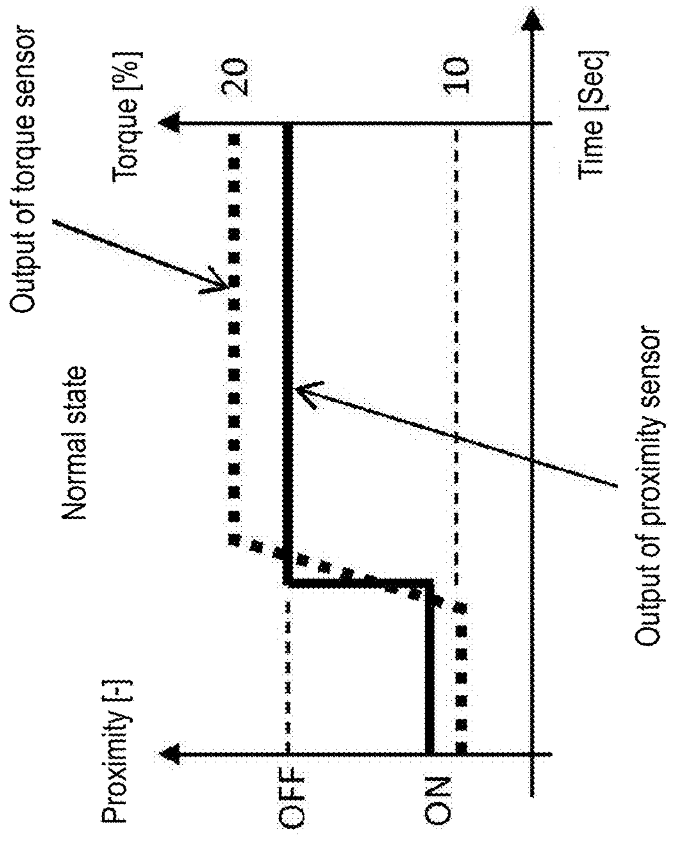
FIG. 8A is a graph showing measurement data of the torque sensor and the proximity sensor in a normal state.

For example, FIG. 8A is a graph showing overlapping measurement data of the torque sensor 81 and the proximity sensor 83 when the pair of hands 61 receives the wafer W from the stage in the cleaning module. As shown in FIG. 8A, at a timing when the wafer W is received (separation from the stage), the measurement data of the torque sensor 81 increases at a certain inclination, whereas the measurement data of the proximity sensor 83 is switched stepwise from ON (proximity) to OFF (separation). Thus, it is possible to accurately index a time axis by using a plurality of sensors in combination.

Figure 7:
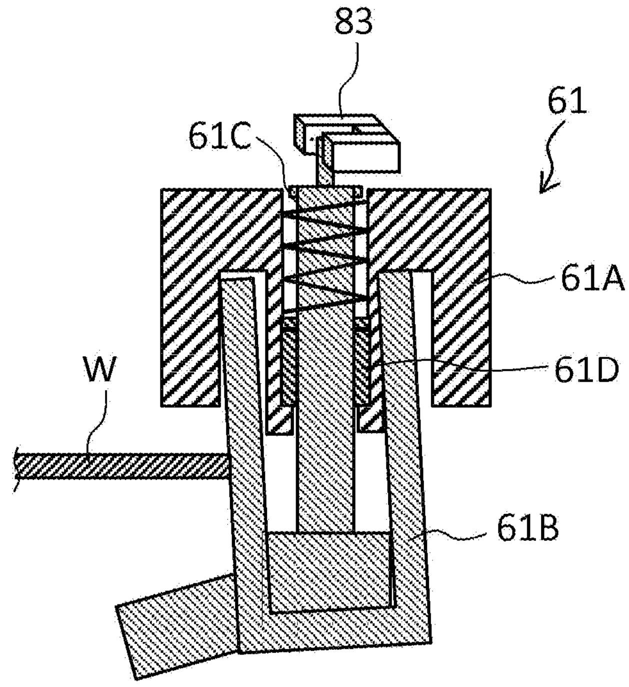
FIG. 7 is a diagram showing a state where a peripheral edge portion of a wafer is sunk into the body of a hook and does not sink in the wafer gripping mechanism including the proximity sensor.

Further, as shown in FIG. 7, when the pair of hands 61 receive the wafer W from the stage in the cleaning module, the peripheral edge of the wafer W is sunk into the body of the hook 81B and does not sink, and the proximity sensor 83 may not be switched to OFF (separation). FIG. 8B is a graph showing overlapping measurement data of the torque sensor 81 and the proximity sensor 83 in this case. Even when such an abnormality occurs, the measurement data of the torque sensor 81 varies in the same manner as in a normal state as shown in FIG. 8B, and thus the abnormality cannot be noticed only from the measurement data of the torque sensor 81. Thus, it is possible to determine whether the pair of hands 61 are accurately gripping the wafer W by using a plurality of sensors in combination.

When it is determined that the wafer W is not held on the pair of hands 61, the control device 15 may stop the operation of the wafer transport mechanism 62. The operation is immediately stopped when an abnormality occurs, which can contribute to reducing downtime of the device.

The control device 15 may estimate the state of the wafer W held on the pair of hands 61 by comparing the measurement data of the sensors 81 to 83 with a second threshold value different from the first threshold value. Here, the estimated state of the wafer W may be any of whether the wafer W is cantilevered by only one of the pair of hands 61, whether the wafer W is broken, whether there is a predetermined amount of water droplets on the wafer W, whether a wear amount of the wafer W for evaluation exceeds a predetermined value, and whether the wafer W is an abnormal individual (an individual with dust or chips).

For example, when the wafer W is cantilevered by only one of the pair of hands 61, a load torque of the servo motor of the rotation mechanism 63 is an intermediate value between a load torque when the wafer W is held on both the hands 61 and a load torque when the wafer W is not held on the hands 61. Thus, the control device 15 stores the intermediate value as the second threshold value, compares the measurement data of the torque sensor 81 with the second threshold value when the hand 61 is in a closed state, and may determine that the wafer W is cantilevered by only one of the pair of hands 61 when a difference therebetween is less than a predetermined value (for example, 5%).

By setting threshold values of the measurement data of the sensors 81 to 83 in accordance with an operation of the device, such as during the transport of the wafer W, during the transfer of the wafer W, or during the retraction of the wafer W, the following applications can also be made.

That is, for example, the control device 15 may count the number of times the measurement data of the sensors 81 to 83 exceeds a threshold value, and may perform a device failure diagnosis in accordance with the counted number of times. Specifically, for example, the control device 15 may count the number of times the measurement data of the sensors 81 to 83 exceeds the first threshold value, and when the number of times reaches a predetermined number of times (for example, 10 times), the control device 15 may determine that this is a sign of a failure of the device.

The control device 15 may confirm the intensity (amplitude) and/or the cycle (frequency) of fluctuations in the measurement data of the sensors 81 to 83 while the wafer gripping mechanisms 601 and 602 are being moved by the vertical moving mechanisms 641 and 642 and the arrangement direction moving mechanism 62, and may detect an abnormality in the device in accordance with the intensity (amplitude) and/or the cycle (frequency) of fluctuations in the measurement data. Specifically, for example, when the intensity (amplitude) of fluctuations of the measurement data of the sensors 81 to 83 exceeds a predetermined value, the control device 15 may determine that there is an abnormality in the device.

Next, an example of an operation of the cleaning and transfer equipment 30 configured as described above will be described.

Figure 9A:
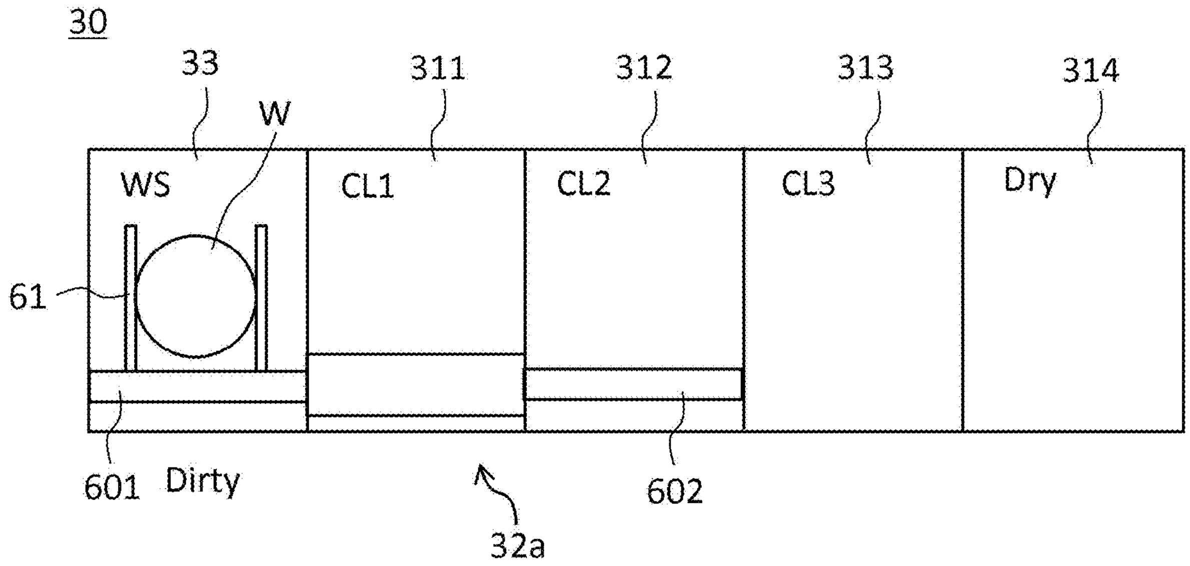
FIG. 9A is a diagram showing an example of an operation of the cleaning and transfer equipment.

First, as shown in FIG. 9A, in a state where the tips of the hands 61 of each of the first wafer gripping mechanism 601 and the second wafer gripping mechanism 602 face upward, the first wafer gripping mechanism 601 and the second wafer gripping mechanism 602 are moved in the arrangement direction of the cleaning modules 311 to 314 by the operation of the arrangement direction moving mechanism 62, and the hands 61 of the first wafer gripping mechanism 601 are stopped at a standby position adjacent to the wafer station 33. Then, the pair of hands 61 of the first wafer gripping mechanism 601 are rotated about the rotation shaft 63A by driving of the rotation mechanism 63, and the tips of the pair of hands 61 are oriented sideways. After the shutter of the wafer station 33 is retracted and the arm passage opening 74 is opened, the pair of hands 61 of the first wafer gripping mechanism 601 are inserted into the wafer station 33 through the arm passage opening 74 and grip the wafer W held on the stage 72. After the wafer W is held on the pair of hands 61, the stage 72 is retracted downward.

At this time, the weight of the wafer W is applied to the pair of hands 61 in a normal state, and the measurement data of the sensors 81 to 83 fluctuates, and thus the control device 15 can compare the measurement data of the sensors 81 to 83 with the first threshold value to detect that the wafer W is held on the pair of hands 61. On the other hand, for example, when the wafer W is broken, the weight of the wafer W is not applied to the pair of hands 61, and the measurement data of the sensors 81 to 83 does not fluctuate. For this reason, the control device 15 can compare the measurement data of the sensors 81 to 83 with the first threshold value to detect that the wafer W is not held on the pair of hands 61 and an abnormality has occurred. When it is determined that the wafer W is not held on the pair of hands 61, the control device 15 stops the operation of the wafer transport mechanism 30.

Figure 9B:
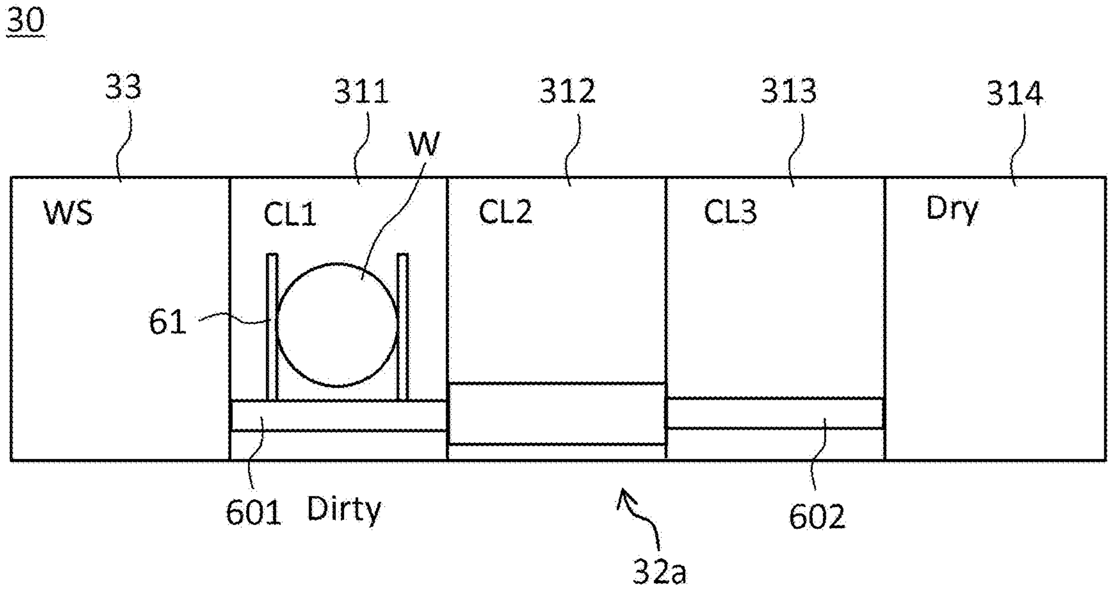
FIG. 9B is a diagram showing an example of an operation of the cleaning and transfer equipment.

Next, as shown in FIG. 9B, after the shutter 97 of the primary cleaning module 311 is retracted and the arm passage opening 94 is opened, the first wafer gripping mechanism 601 and the second wafer gripping mechanism 602 are moved in the arrangement direction of the cleaning modules 311 to 314 by the operation of the arrangement direction moving mechanism 62, and the wafer W held on the pair of hands 61 of the first wafer gripping mechanism 601 is transported from the wafer station 33 to the primary cleaning module 311 and is transferred to the cleaning machine of the primary cleaning module 311.

During the transport of the wafer W from the wafer station 33 to the primary cleaning module 311, the weight of the wafer W is applied to the pair of hands 61 in a normal state, and thus the measurement data of the sensors 81 to 83 does not fluctuate. For this reason, the control device 15 can compare the measurement data of the sensors 81 to 83 with the first threshold value to detect that the wafer W is held on the pair of hands 61. On the other hand, for example, when the wafer W falls off during transport, the weight of the wafer W is not applied to the pair of hands 61, and the measurement data of the sensors 81 to 83 fluctuates. Thus, the control device 15 can compare the measurement data of the sensors 81 to 83 with the first threshold value to detect that the wafer W is not held on the pair of hands 61 and an abnormality has occurred. When it is determined that the wafer W is not held on the pair of hands 61, the control device 15 stops the operation of the wafer transport mechanism 30.

Furthermore, at a timing when the primary cleaning module 311 is transferred to the cleaning machine, the weight of the wafer W is removed from the pair of hands 61 in a normal state, and the measurement data of the sensors 81 to 83 fluctuates. For this reason, the control device 15 can compare the measurement data of the sensors 81 to 83 with the first threshold value to detect that the transfer has been completed.

After the wafer W is transferred to the cleaning machine of the primary cleaning module 311, the pair of hands 61 are taken out of the housing 91 of the primary cleaning module 311, the arm passage opening 94 is closed by the shutter 97, and the wafer W is cleaned by the cleaning machine of the primary cleaning module 311.

After the cleaning processing in the primary cleaning module 311 is completed, the shutter 97 is retracted and the arm passage opening 94 is opened. The pair of hands 61 of the first wafer gripping mechanism 601 are inserted into the housing 91 of the primary cleaning module 311 through the arm passage opening 94 and grip the wafer W cleaned by the cleaning machine. Also at this time, the control device 15 can compare the measurement data of the sensors 81 to 83 with the first threshold value to determine whether the wafer W is held on the pair of hands 61. When it is determined that the wafer W is not held on the pair of hands 61, the control device 15 stops the operation of the wafer transport mechanism 30.

Figure 9C:
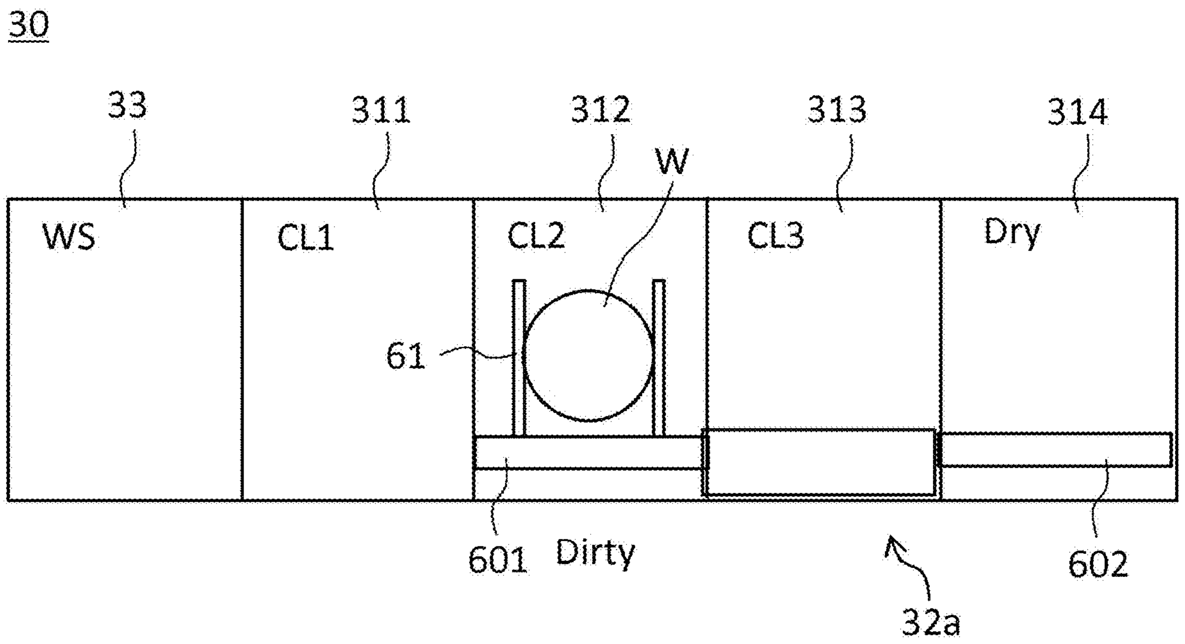
FIG. 9C is a diagram showing an example of an operation of the cleaning and transfer equipment.

Next, as shown in FIG. 9C, after the shutter 97 of the secondary cleaning module 312 is retracted and the arm passage opening 94 is opened, the first wafer gripping mechanism 601 and the second wafer gripping mechanism 602 are moved in the arrangement direction of the cleaning modules 311 to 314 by the operation of the arrangement direction moving mechanism 62, and the wafer W held on the pair of hands 61 is transported from the primary cleaning module 311 to the secondary cleaning module 312 and transferred to the cleaning machine of the cleaning module 312. Even while the wafer W is transported from the primary cleaning module 311 to the secondary cleaning module 312, the control device 15 can compare the measurement data of the sensors 81 to 83 with the first threshold value to determine whether the wafer W is held on the pair of hands 61. When it is determined that the wafer W is not held on the pair of hands 61, the control device 15 stops the operation of the wafer transport mechanism 30. Further, at a timing when the wafer W is transferred to the cleaning machine of the secondary cleaning module 312, the control device 15 can detect that the transfer has been completed by comparing the measurement data of the sensors 81 to 83 with the first threshold value.

Next, after the pair of hands 61 of the first wafer gripping mechanism 601 are taken out of the housing 91 of the secondary cleaning module 312, the arm passage opening 94 is closed by the shutter 97, and the wafer W is cleaned by the cleaning machine of the secondary cleaning module 312.

Figure 9D:
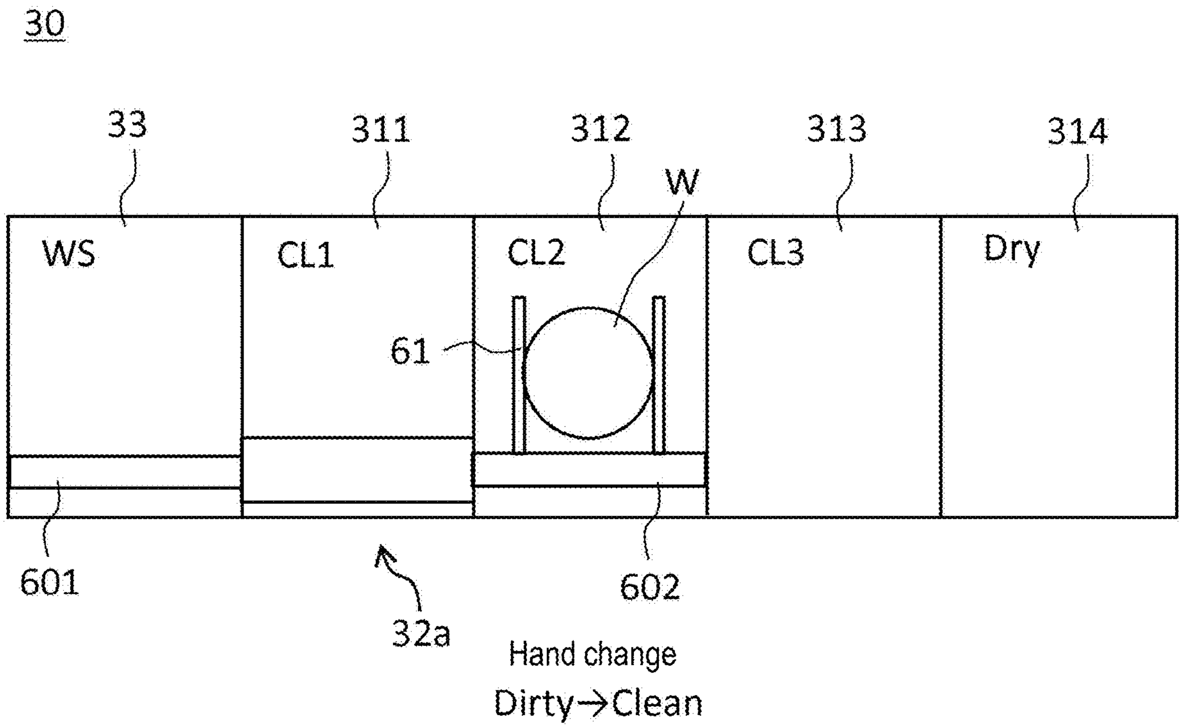
FIG. 9D is a diagram showing an example of an operation of the cleaning and transfer equipment.

Next, as shown in FIG. 9D, the hands 61 of the first wafer gripping mechanism 601 are rotated about the rotation shaft 63A by driving of the rotation mechanism 63, and the tips of the hands 61 are oriented upward. Then, in a state where the tips of the hands 61 of each of the first wafer gripping mechanism 601 and the second wafer gripping mechanism 602 face upward, the first wafer gripping mechanism 601 and the second wafer gripping mechanism 602 are moved in the arrangement direction of the first cleaning modules 311 to 314 by driving of the arrangement direction moving mechanism 62 and the hands 61 of the second wafer gripping mechanism 602 are stopped at a standby position adjacent to the secondary cleaning module 312. The hands 61 of the second wafer gripping mechanism 602 are rotated about the rotation shaft 632A by driving of the rotation mechanism 63, and the tips of the hands 61 are oriented sideways.

After the cleaning processing in the secondary cleaning module 312 is completed, the shutter 97 is retracted and the arm passage opening 94 is opened. The pair of hands 61 of the second wafer gripping mechanism 602 are inserted into the housing 91 of the secondary cleaning module 312 through the arm passage opening 94 and grip the wafer W cleaned by the cleaning machine. Also at this time, the control device 15 can compare the measurement data of the sensors 81 to 83 with the first threshold value to determine whether the wafer W is held on the pair of hands 61. When it is determined that the wafer W is not held on the pair of hands 61, the control device 15 stops the operation of the wafer transport mechanism 30.

In the present embodiment, the wafer W before cleaning in the secondary cleaning module 312 is gripped and transported by the hands 61 of the first wafer gripping mechanism 601, and the wafer W after cleaning in the secondary cleaning module 312 is gripped and transported by the hands 61 of the second wafer gripping mechanism 602. That is, a hand is replaced in the secondary cleaning module 312. Thereby, it is possible to prevent the hands 61 of the first wafer gripping mechanism 601 from coming into contact with the wafer W after cleaning in the secondary cleaning module 312 and contaminating the wafer W.

Figure 9E:
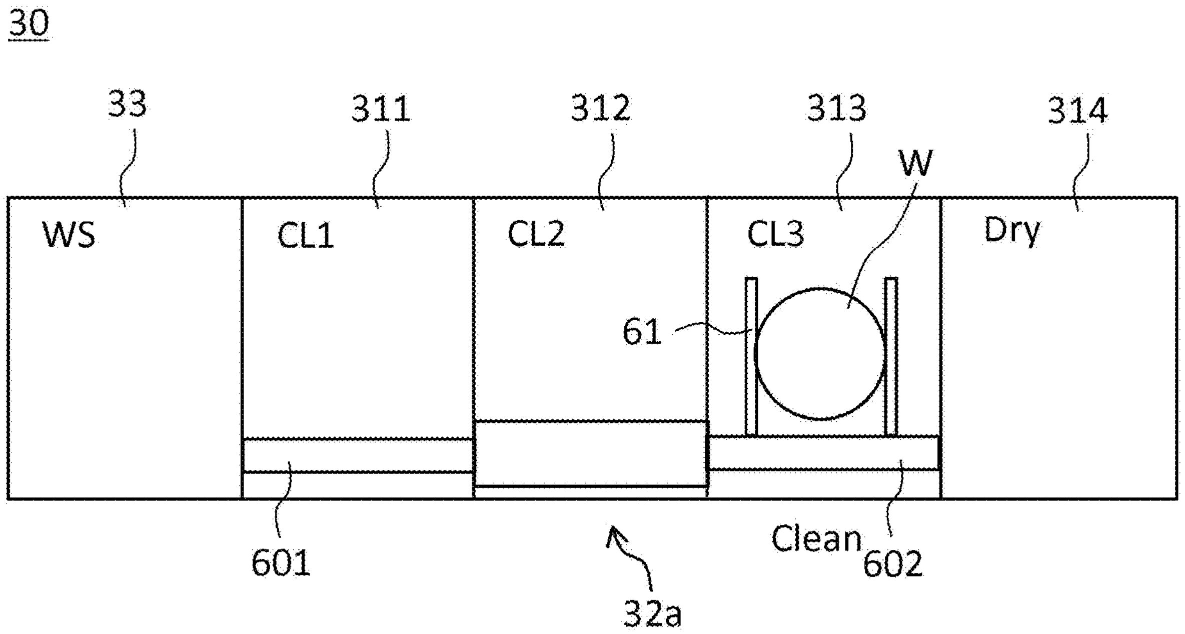
FIG. 9E is a diagram showing an example of an operation of the cleaning and transfer equipment.

Next, as shown in FIG. 9E, after the shutter 97 of the tertiary cleaning module 313 is retracted and the arm passage opening 94 is opened, the first wafer gripping mechanism 601 and the second wafer gripping mechanism 602 are moved in the arrangement direction of the cleaning modules 311 to 314 by the operation of the arrangement direction moving mechanism 62, and the wafer W held on the pair of hands 61 of the second wafer gripping mechanism 602 is transported from the secondary cleaning module 312 to the tertiary cleaning module 313 and transferred to the cleaning machine of the tertiary cleaning module 313. Even while the wafer W is transported from the secondary cleaning module 312 to the tertiary cleaning module 313, the control device 15 can compare the measurement data of the sensors 81 to 83 with the first threshold value to detect that the wafer W is held on the pair of hands 61. When it is determined that the wafer W is not held on the pair of hands 61, the control device 15 stops the operation of the wafer transport mechanism 30. Further, at a timing when the wafer W is transferred to the cleaning machine of the tertiary cleaning module 313, the control device 15 can compare the measurement data of the sensors 81 to 83 with the first threshold value to detect that the transfer has been completed.

Next, after the pair of hands 61 of the second wafer gripping mechanism 602 are taken out of the housing 91 of the tertiary cleaning module 313, the arm passage opening 94 is closed by the shutter 97, and the wafer W is cleaned by the cleaning machine of the tertiary cleaning module 313.

After the cleaning processing in the tertiary cleaning module 313 is completed, the shutter 97 is retracted and the arm passage opening 94 is opened. A pair of second arms 612 of the second wafer gripping mechanism 602 are inserted into the housing 91 of the tertiary cleaning module 313*a* through the arm passage opening 94 and grip the wafer W cleaned by the cleaning machine. Also at this time, the control device 15 can compare the measurement data of the sensors 81 to 83 with the first threshold value to determine whether the wafer W is held on the pair of hands 61. When it is determined that the wafer W is not held on the pair of hands 61, the control device 15 stops the operation of the wafer transport mechanism 30.

Figure 9F:
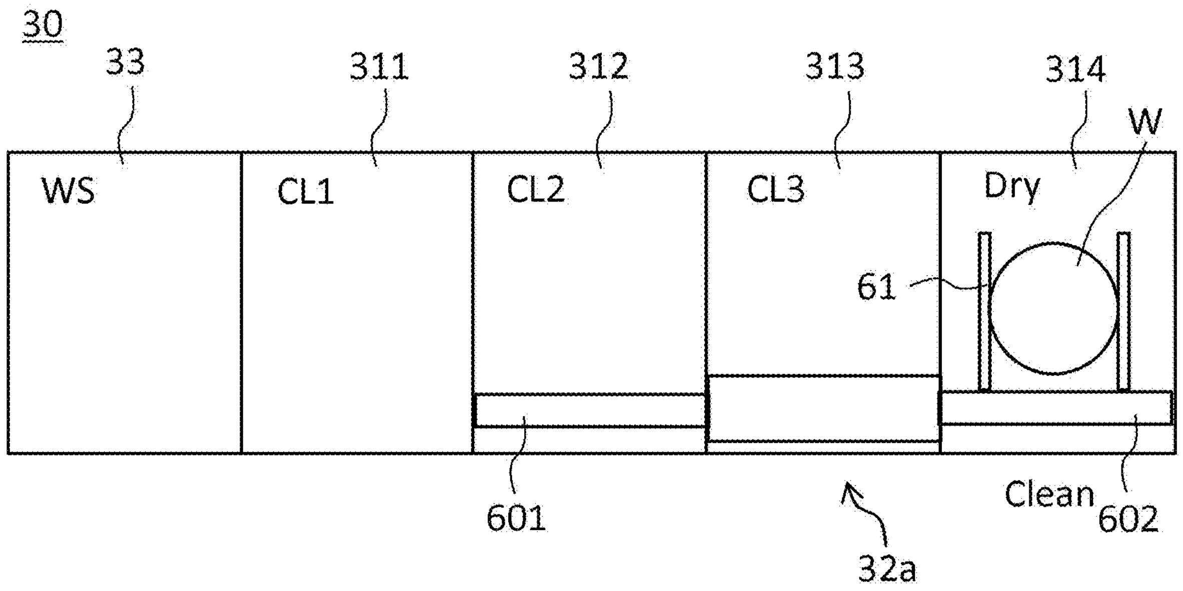
FIG. 9F is a diagram showing an example of an operation of the cleaning and transfer equipment.
Figure 10A:
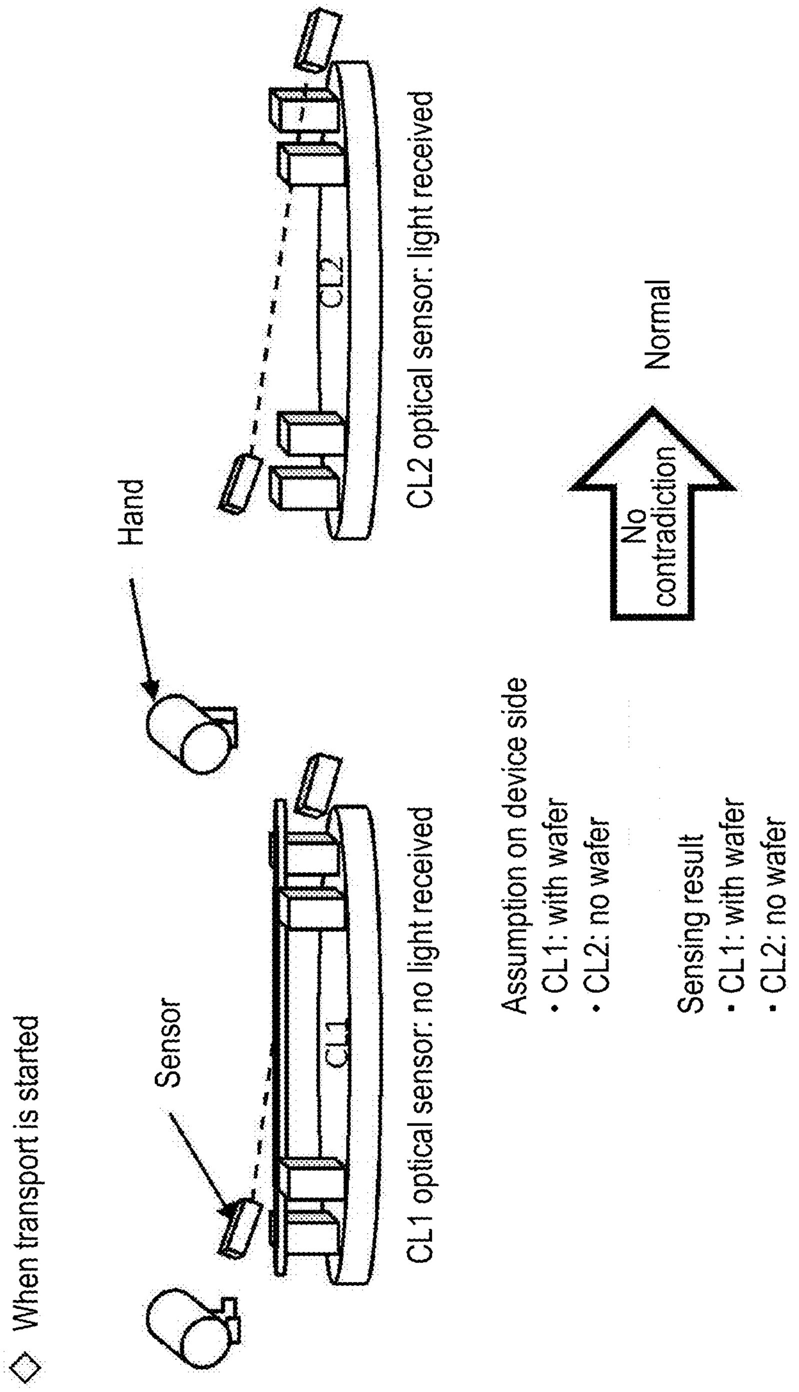
FIG. 10A is a diagram showing determination of the presence or absence of a wafer based on a detection result of an optical sensor at the start of wafer transport in a normal state.
Figure 10B:
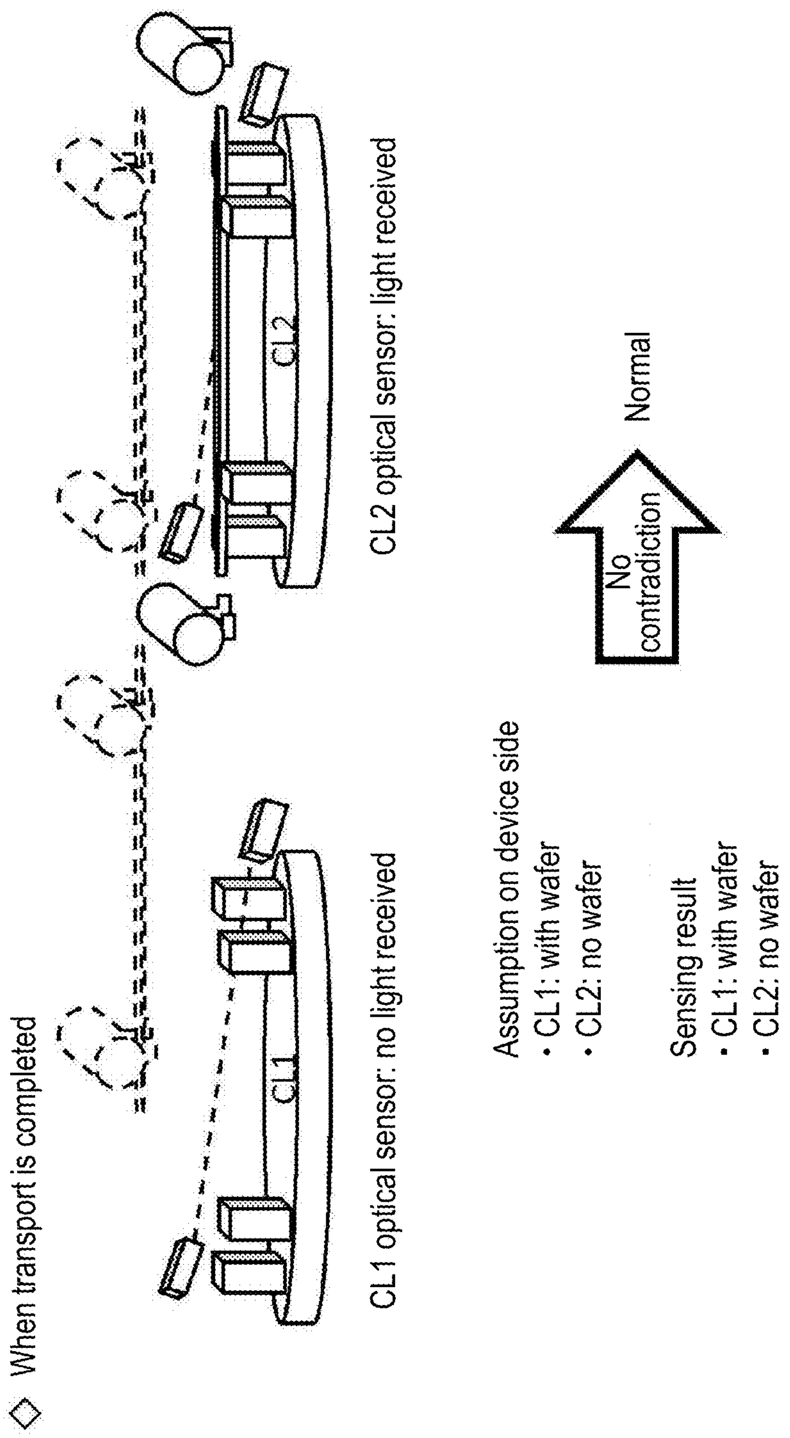
FIG. 10B is a diagram showing determination of the presence or absence of a wafer based on a detection result of the optical sensor at the time of completion of wafer transport in a normal state.
Figure 10C:
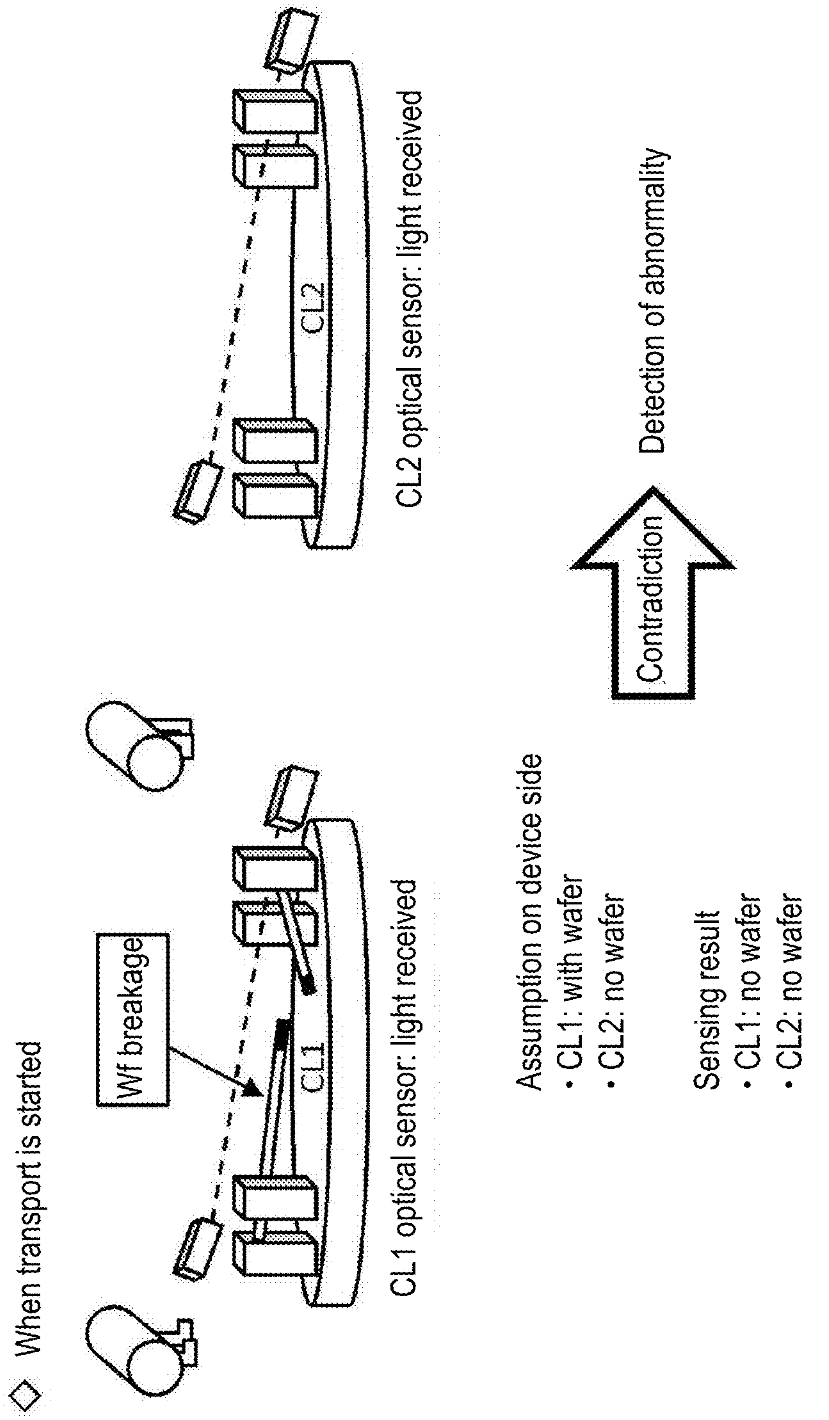
FIG. 10C is a diagram showing determination of the presence or absence of a wafer based on a detection result of the optical sensor at the start of wafer transport in an abnormal state.
Figure 10D:
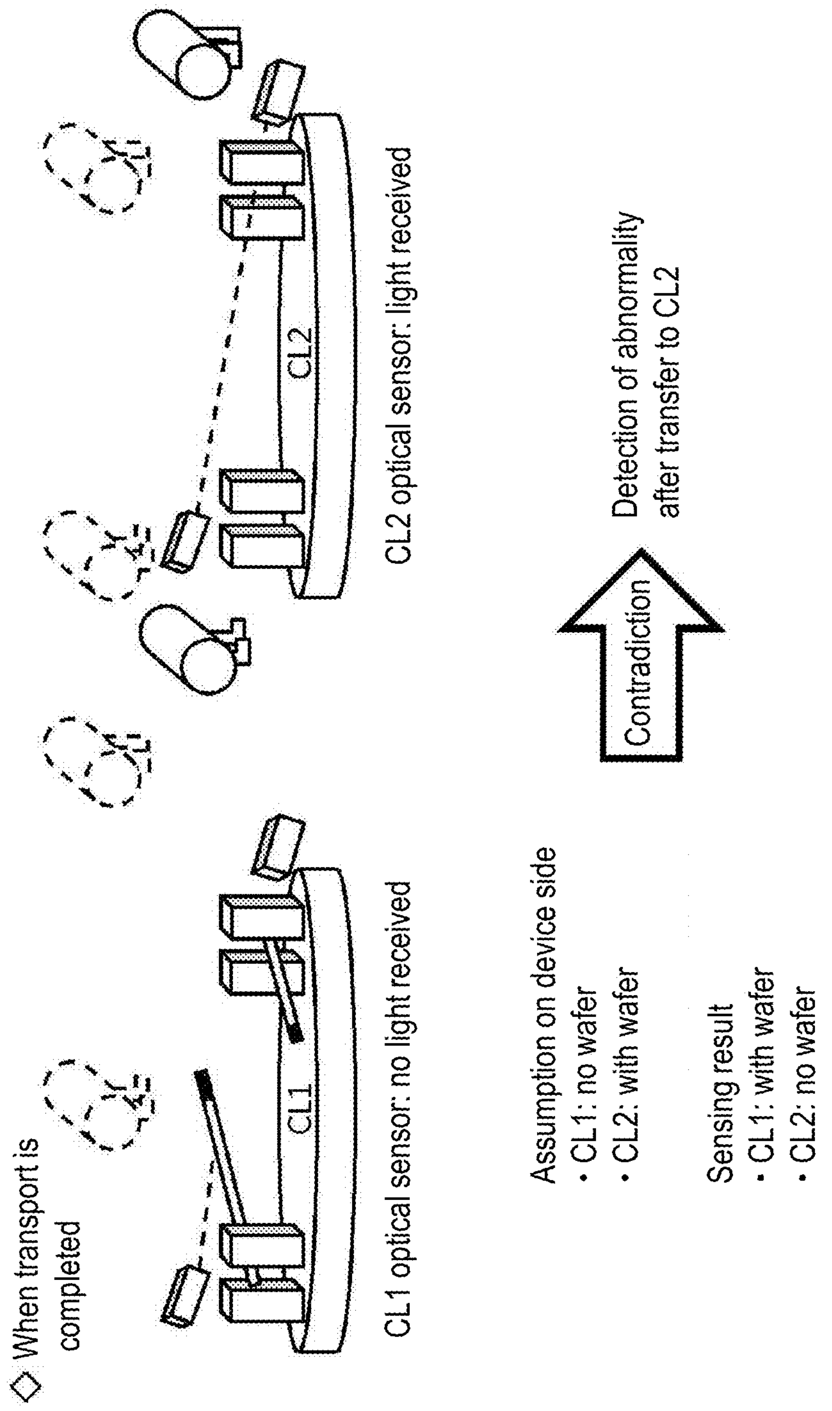
FIG. 10D is a diagram showing determination of the presence or absence of a wafer based on a detection result of the optical sensor at the time of completion of wafer transport in an abnormal situation.

Next, as shown in FIG. 9F, after the shutter 97 of the quaternary cleaning module 314 is retracted and the arm passage opening 94 is opened, the first wafer gripping mechanism 601 and the second wafer gripping mechanism 602 are moved in the arrangement direction of the cleaning modules 311 to 314 by the operation of the arrangement direction moving mechanism 62, and the wafer W held on the pair of hands 61 of the second wafer gripping mechanism 602 is transported from the tertiary cleaning module 313 to the quaternary cleaning module 314 and transferred to the cleaning machine of the quaternary cleaning module 314. Even while the wafer W is transported from the tertiary cleaning module 313 to the quaternary cleaning module 314, the control device 15 can compare the measurement data of the sensors 81 to 83 with the first threshold value to determine that the wafer W is held on the pair of hands 61. When it is determined that the wafer W is not held on the pair of hands 61, the control device 15 stops the operation of the wafer transport mechanism 30. Further, at a timing when the wafer is transferred to the cleaning machine of the quaternary cleaning module 314, the control device 15 can detect that the transfer has been completed by comparing the measurement data of the sensors 81 to 83 with the first threshold value.

Next, after the pair of hands 61 of the second wafer gripping mechanism 602 are taken out of the housing 91 of the quaternary cleaning module 314, the arm passage opening 94 is closed by the shutter 97, and the wafer W is cleaned by the cleaning machine of the quaternary cleaning module 314 and is dried.

After the cleaning and drying processing in the quaternary cleaning module 314 are completed, the shutter 97 is retracted and the arm passage opening 94 is opened. The hand of the transport robot 111 of the loading/unloading unit 11 described above is inserted into the housing 91 of the quaternary cleaning module 314 through the arm passage opening 94 and is cleaned by the cleaning machine, and the wafer W that has been subjected to drying processing is taken out to the loading/unloading unit 11 as a final step (for example, spinning).

According to the present embodiment as described above, the sensors 81 to 83 that measure values corresponding to weights applied to the pair of hands 61 when the pair of hands 61 are in a closed state are provided in the wafer gripping mechanisms 601 and 602 that are moved by the vertical moving mechanisms 641 and 642 and the arrangement direction moving mechanism 62, and thus it is possible to determine whether the wafer W is held on the pair of hands 61 even during the operation of the vertical moving mechanisms 641 and 642 and the arrangement direction moving mechanism 62 (during transport of the wafer). Thereby, it is possible to rapidly detect and cope with transport errors. Further, it is possible to track position information of the wafer W being transported.

Further, according to the present embodiment, it is possible to determine whether the wafer W is held on the pair of hands 61 even during the transport of the wafer, and when an abnormality occurs, the control device 15 immediately stops the operation of the wafer transport mechanism 32, and thus it is possible to contribute to reducing downtime of the device.

Although the embodiment and the modification examples of the disclosure have been described above by means of examples, the scope of the disclosure is not limited thereto, and may be changed or modified in accordance with the purpose within the scope of the claims. In addition, the embodiment and the modification examples can be combined as appropriate within a range that does not conflict with the processing contents.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A cleaning and transfer equipment comprising:

a plurality of cleaning modules that are disposed in series;

a wafer transport mechanism that transports a wafer between the plurality of cleaning modules; and a control device that controls an operation of the wafer transport mechanism, wherein the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction, and a sensor that measures a value corresponding to a weight applied to the pair of hands when the pair of hands are in a closed state, and the control device compares measurement data of the sensor with a predetermined threshold value to determine whether the wafer is held on the pair of hands, wherein the rotation mechanism is configured to drive tip ends of the pair of hands to rotate upward, and the sensor includes a torque sensor that measures a load torque of a servo motor included in the rotation mechanism.

2. The cleaning and transfer equipment according to claim 1, wherein the control device stops an operation of the wafer transport mechanism when it is determined that the wafer is not held on the pair of hands.

3. The cleaning and transfer equipment according to claim 1, wherein the sensor includes a displacement sensor that measures relative height positions of tip ends of the pair of hands with respect to base ends.

4. The cleaning and transfer equipment according to claim 1, wherein the pair of hands include a hand main body, a hook disposed to be suspended below the hand main body, and an elastic member that elastically supports the hook with respect to the hand main body, and the sensor is a proximity sensor that is disposed on the hand main body and detects approaching or separation of the hook.

5. The cleaning and transfer equipment according to claim 1, wherein the pair of hands include a hand main body, a hook disposed to be suspended below the hand main body, and an elastic member that elastically supports the hook with respect to the hand main body, and the sensor includes: the torque sensor or both of the torque sensor and a displacement sensor that measures relative height positions of the tip ends of the pair of hands with respect to base ends; and a proximity sensor that is disposed on the hand main body and detects approaching or separation of the hook.

6. The cleaning and transfer equipment according to claim 1, wherein the control device compares the measurement data of the sensor with a second threshold value different from the threshold value to estimate a state of the wafer held on the pair of hands.

7. The cleaning and transfer equipment according to claim 6, wherein the state of the wafer is any of whether the wafer is cantilevered by only one of the pair of hands, whether the wafer is broken, whether there is a predetermined amount of water droplets on the wafer, and whether a wear amount of a wafer for evaluation exceeds a predetermined value, and whether the wafer is an abnormal individual.

8. The cleaning and transfer equipment according to claim 1, wherein the control device performs a device failure diagnosis by counting a number of times the measurement data of the sensor exceeds the threshold value.

9. The cleaning and transfer equipment according to claim 1, wherein the control device detects an abnormality by confirming fluctuations in the measurement data of the sensor while the wafer gripping mechanism is being moved by the vertical moving mechanism and the arrangement direction moving mechanism.

10. A wafer treatment equipment comprising:

a polishing unit that polishes a wafer; and a cleaning unit that cleans the wafer after polishing, wherein the cleaning unit includes the cleaning and transfer equipment according to claim 1.

11. A transfer equipment comprising:

a wafer transport mechanism that transports a wafer between a plurality of cleaning modules disposed in series; and a control device that controls an operation of the wafer transport mechanism, wherein the wafer transport mechanism includes a wafer gripping mechanism that grips the wafer, a vertical moving mechanism that vertically moves the wafer gripping mechanism, and an arrangement direction moving mechanism that moves the wafer gripping mechanism in an arrangement direction of the plurality of cleaning modules, the wafer gripping mechanism includes a pair of hands that are openable and closeable, a rotation mechanism that rotates the pair of hands about a rotation shaft parallel to an opening/closing direction so that tip ends of the pair of hands face upward, and a sensor that measures a value corresponding to a weight applied to the pair of hands when the pair of hands are in a closed state, and the control device compares measurement data of the sensor with a predetermined threshold value to determine whether the wafer is held on the pair of hands, wherein the rotation mechanism is configured to drive tip ends of the pair of hands to rotate upward, and the sensor includes a torque sensor that measures a load torque of a servo motor included in the rotation mechanism.

* * * * *